(12) United States Patent
Zuppero et al.

(10) Patent No.: US 7,223,914 B2
(45) Date of Patent: *May 29, 2007

(54) PULSED ELECTRON JUMP GENERATOR

(75) Inventors: Anthony C Zuppero, Pollock Pines, CA (US); Jawahar M Gidwani, San Francisco, CA (US)

(73) Assignee: NeoKismet LLC, San Francisco, CA (US)

( * ) Notice: Subject to any disclaimer, the term of this patent is extended or adjusted under 35 U.S.C. 154(b) by 427 days.

This patent is subject to a terminal disclaimer.

(21) Appl. No.: 09/682,363

(22) Filed: Aug. 24, 2001

(65) Prior Publication Data

US 2002/0017827 A1 Feb. 14, 2002

Related U.S. Application Data

(60) Continuation-in-part of application No. 09/589,669, filed on Jun. 7, 2000, now Pat. No. 6,327,859, which is a division of application No. 09/304,979, filed on May 4, 1999, now Pat. No. 6,114,620.

(51) Int. Cl.
*H01L 31/00* (2006.01)
(52) U.S. Cl. ............ 136/253; 136/252; 136/248; 136/291; 310/300; 310/314; 310/322; 60/721; 60/532
(58) Field of Classification Search ............ 136/252, 136/253, 248, 291, 254, 205, 201; 310/300, 310/314, 322; 60/721, 532

See application file for complete search history.

(56) References Cited

U.S. PATENT DOCUMENTS

| 3,483,040 | A | | 12/1969 | Parkins |
| 3,694,770 | A | | 9/1972 | Burwell et al. |
| 3,916,338 | A | | 10/1975 | Jensen et al. |
| 4,012,301 | A | * | 3/1977 | Rich et al. ............. 204/157.41 |
| 4,045,359 | A | * | 8/1977 | Fletcher et al. ............ 422/186 |
| 4,407,705 | A | * | 10/1983 | Garscadden et al. ... 204/157.22 |

(Continued)

FOREIGN PATENT DOCUMENTS

DE    1230509    12/1966

(Continued)

OTHER PUBLICATIONS

Achermann, M. et al., "Carrier dynamics around nano-scale Schottky contacts: a femtosecond near-field study", Applied Surface Science 7659 (2002) 1-4.

(Continued)

*Primary Examiner*—Nam Nguyen
*Assistant Examiner*—Anthony Fick
(74) *Attorney, Agent, or Firm*—Orrick Herrington & Sutcliffe, LLP

(57) ABSTRACT

A device and method for stimulating pulsed chemical reactions in a small volume of gaseous reactants. An emitter stimulates the reactions of a fuel oxidizer mixture and a collector converts the vibrational energy of the resulting products into useful energy. The device may also include a reaction region, a collector, and reactants such as fuel and oxidizer. In one embodiment, air including exhausts is made to flow into and out of the reaction region, and fuel is made to flow into the reaction region. The device may be configured in several geometries, including but not limited to, a V-channel, a box and a plane.

35 Claims, 5 Drawing Sheets

U.S. PATENT DOCUMENTS

| | | | |
|---|---|---|---|
| 4,590,507 | A | 5/1986 | Capasso et al. |
| 4,634,641 | A | 1/1987 | Nozik |
| 4,651,324 | A | 3/1987 | Prein et al. |
| 4,686,550 | A | 8/1987 | Capasso et al. |
| 4,753,579 | A | 6/1988 | Murphy |
| 4,756,000 | A | 7/1988 | Macken |
| 4,793,799 | A | 12/1988 | Goldstein et al. |
| 4,849,799 | A | 7/1989 | Capasso et al. |
| 5,048,042 | A | 9/1991 | Moser et al. |
| 5,057,162 | A | 10/1991 | Nelson |
| 5,124,610 | A | 6/1992 | Conley et al. |
| 5,293,857 | A | 3/1994 | Meyer |
| 5,299,422 | A | 4/1994 | Nakagawa et al. |
| 5,311,009 | A | 5/1994 | Capasso et al. |
| 5,317,876 | A | 6/1994 | Nakagawa et al. |
| 5,337,329 | A | 8/1994 | Foster |
| 5,362,975 | A | 11/1994 | von Windheim et al. |
| 5,404,712 | A * | 4/1995 | Few et al. ............... 60/39.821 |
| 5,408,967 | A | 4/1995 | Foster |
| 5,470,395 | A * | 11/1995 | Yater et al. .................. 136/203 |
| 5,488,231 | A | 1/1996 | Kwon et al. |
| 5,525,041 | A | 6/1996 | Deak |
| 5,587,827 | A | 12/1996 | Hakimi et al. |
| 5,593,509 | A | 1/1997 | Zuppero et al. |
| 5,632,870 | A | 5/1997 | Kucherov |
| 5,641,585 | A | 6/1997 | Lessing et al. |
| 5,651,838 | A | 7/1997 | Fraas et al. |
| 5,674,698 | A | 10/1997 | Zarling et al. |
| 5,698,397 | A | 12/1997 | Zarling et al. |
| 5,736,410 | A | 4/1998 | Zarling et al. |
| 5,757,833 | A | 5/1998 | Arakawa et al. |
| 5,763,189 | A | 6/1998 | Buechler et al. |
| 5,780,727 | A | 7/1998 | Gimzewski et al. |
| 5,891,656 | A | 4/1999 | Zarling et al. |
| 5,917,195 | A | 6/1999 | Brown |
| 5,932,885 | A | 8/1999 | DeBellis et al. |
| 5,999,547 | A | 12/1999 | Schneider et al. |
| 6,067,309 | A | 5/2000 | Onomura et al. |
| 6,084,173 | A | 7/2000 | DiMatteo |
| 6,114,620 | A * | 9/2000 | Zuppero et al. ............. 136/253 |
| 6,119,651 | A | 9/2000 | Anderson |
| 6,159,686 | A | 12/2000 | Kardos et al. |
| 6,172,427 | B1 * | 1/2001 | Shinohara et al. ........ 290/40 B |
| 6,218,608 | B1 * | 4/2001 | Zuppero et al. ............. 136/253 |
| 6,222,116 | B1 * | 4/2001 | Zuppero et al. ............. 136/253 |
| 6,232,546 | B1 | 5/2001 | DiMatteo et al. |
| 6,238,931 | B1 | 5/2001 | Buechler et al. |
| 6,251,687 | B1 | 6/2001 | Buechler et al. |
| 6,268,560 | B1 * | 7/2001 | Zuppero et al. ............. 136/253 |
| 6,312,914 | B1 | 11/2001 | Kardos et al. |
| 6,327,859 | B1 * | 12/2001 | Zuppero et al. ............... 60/721 |
| 6,396,191 | B1 | 5/2002 | Hagelstein et al. |
| 6,399,397 | B1 | 6/2002 | Zarling et al. |
| 6,444,476 | B1 | 9/2002 | Morgan |
| 6,537,829 | B1 | 3/2003 | Zarling et al. |
| 6,649,823 | B2 * | 11/2003 | Zuppero et al. ............. 136/252 |
| 6,678,305 | B1 * | 1/2004 | Zuppero et al. ............... 372/89 |
| 6,700,056 | B2 * | 3/2004 | Zuppero et al. ............. 136/252 |
| 6,916,451 | B1 * | 7/2005 | Zuppero et al. ....... 422/186.03 |
| 6,944,202 | B2 * | 9/2005 | Zuppero et al. ............... 372/89 |
| 2001/0018923 | A1 * | 9/2001 | Zupper et al. ............. 136/248 |
| 2002/0017827 | A1 | 2/2002 | Zuppero et al. |
| 2002/0045190 | A1 | 4/2002 | Wilson et al. |
| 2002/0070632 | A1 | 6/2002 | Zuppero et al. |
| 2002/0121088 | A1 | 9/2002 | Zuppero et al. |
| 2002/0196825 | A1 * | 12/2002 | Zuppero et al. ............... 372/39 |
| 2003/0000570 | A1 * | 1/2003 | Zuppero et al. ............. 136/252 |
| 2003/0019517 | A1 | 1/2003 | McFarland |
| 2003/0030067 | A1 | 2/2003 | Chen |
| 2003/0100119 | A1 | 5/2003 | Weinberg et al. |
| 2003/0166307 | A1 * | 9/2003 | Zuppero et al. ............... 438/9 |
| 2003/0207331 | A1 | 11/2003 | Wilson et al. |
| 2004/0182431 | A1 * | 9/2004 | Zuppero et al. ............. 136/243 |
| 2005/0189011 | A1 * | 9/2005 | Zuppero et al. ............. 136/243 |

FOREIGN PATENT DOCUMENTS

| | | |
|---|---|---|
| DE | 37 43 399 A1 | 7/1989 |
| EP | 0713089 | 5/1996 |
| JP | 63-42181 | 2/1988 |
| JP | 02157012 A | 6/1990 |
| JP | 2-264101 A * | 10/1990 |
| NL | 1065463 | 4/1967 |
| WO | WO 00/72384 A1 | 11/2000 |
| WO | WO 01/28677 A1 | 4/2001 |
| WO | WO 01/28677 A1 | 4/2001 |
| WO | WO 01/29938 A1 | 4/2001 |

OTHER PUBLICATIONS

Aeschlimann, M. et al., "Competing nonradiative channels for hot electron induced surface photochemistry", Chemical Physics, Apr. 15, 1996, pp. 127-141, vol. 205, Issue: 1-2.

Aeschlimann, M. et al., "Ultrafast electron dynamics in metals", The Ultrafast Surface Science Group, http://www.ilp/physik.uni-essen.de/aeschlimann/2y_photo.htm, date unknown.

Auerbach, D. et al., "Reagent Vibrational Excitation: A Key to Understanding Chemical Dynamics at Surface ?", abstract only, date unknown.

Balandin, A. et al., "Significant decrease of the lattice thermal conductivity due to phonon confinement in a free-standing semiconductor quantum well", Physical Review B, Jul. 15, 1998, vol. 58, Issue 3, pp. 1545-1549.

Balandin, A. et al., "Effect of phonon confinement on the thermoelectric figure of merit of quantum wells", Journal of Applied Physics, Dec. 1, 1998, vol. 84, Issue 11, pp. 6419-6153.

Bonn, M. et al., "Phono- Versus Electron-Mediated Desorption and Oxidation of CO on Ru(0001)", Science, vol. 285, No. 5430, Issue of Aug. 13, 1999, pp. 1042-1045.

Chang, Y. et al., "Coherent phonon spectroscopy of GaAs surfaces using time-resolved second-harmonic generation", Chemical Physics, 251/1-3, pp. 283-308, (2000).

Chen,-C. et al., "Hot electron reduction at n-Si/Au thin film electrodes", Journal-of-the-Electrochemical-Society, vol. 139, Nov. 1992, pp. 3243-3249.

Choi, C.K. et al., "Ultrafast carrier dynamics in a highly excited GaN epilayer", Physical Review B, vol. 63, 115315, Mar. 15, 2001, 6 pages.

Debernardi, A. et al., "Anharmonic Phonon Lifetimes in Semiconductors from Density-Functional Perturbation Theory", Physical Review Letters, vol. 75, No. 9, Aug. 28, 1995, pp. 1819-1822.

Delfatti, N. et al., "Temperature-dependent electron-lattice thermalization in GaAs", Physical Review B, Feb. 15, 1999-I, vol. 59, No. 7, pp. 4576-4579.

Denzler, D.N., et al., "Surface femtochemistry: Ultrafast reaction dynamics driven by hot electron mediated reaction pathways", Femtochemistry and Femtobiology: Ultrafast Dynamics in Molecular Science. (World Scientific. 2002).

Diesing, D. et al., "Surface reactions with hot electrons and hot holes in metals", Surface Science, 331-333, 1995, pp. 289-293.

Driskill-Smith, A. A. G. et al., "The "nanotriode:" A nanoscale field-emission tube", Applied Physics Letters, Nov. 1, 1999, vol. 75, Issue 18, pp. 2845-2847.

Fan, C. Y. et al., "The oxidation of CO on $RuO_2$—110—at room temperature", Journal of Chemical Physics, vol. 114, No. 22, Jun. 8, 2001, P 10058.

Frese, K.W., Jr. et al., "Hot electron reduction at etched n-Si/Pt thin film electrodes", Journal-of-the-Electrochemical-Society, vol. 141, Sep. 1994, pp. 2402-2409.

Funk, S. et al., "Desportion of CO from Ru—001—induced by near-infrared femtosecond laser pulses", Journal of Chemical Physics, vol. 112, No. 22, Jun. 8, 2000, pp. 9888-9897.

Gadzuk, J. W., "Resonance-assisted hot electron femtochemistry at surfaces", Physical Review Letters, May 27, 1996, vol. 76, Issue 22, pp. 4234-4237.

Gadzuk, J.W., "Multiple Electron Processes in Hot-Electron Femtochemistry at Surfaces", http://www.cstl.nist.gov/div837/837.03/highlite/gadzuk1999.htm, date unknown.

Gadzuk, J.W., "Surface Femtochemistry with Fast Lasers and Slow Nanostructures", http://www.cstl.nist.gov/div837/837.03/highlite/previous/dietmim.htm, date unknown.

Gaillard, F. et al., "Hot electron generation in aqueous solution at oxide-covered tantalum electrodes. Reduction of methylpyridinium and electrogenerated chemiluminescence of Ru(bpy)32+", Journal of Physical Chemistry B. vol. 103, No. 4, Jan. 28, 1999, pp. 667-674.

GAO, S., "Quantum kinectic theory of virbrational heating and bond breaking by hot electrons", Physical Review B, vol. 55, No. 3, Jan. 15, 1997-I, pp. 1876-1886.

Gergen, B. et al., "Chemically Induced Electronic Excitations at Metal Surfaces", Science, vol. 294, No. 5551, Issue of Dec. 21, 2001, pp. 2521-2523.

Guo, J. et al., "The desporption yield dependence on wavelength of femtosecond laser from CO/Cu(111)", Annual Meeting of the American Physical Society, Mar. 1999, Atlanta, GA; Session BC18—Surfaces (General), ORAL session, Mar. 21; Room 258W, GWCC [BC18.06].

Hess, S. et al., "Hot Carrier Relaxation by Extreme Electron—LO Phonon Scattering in GaN", http://www.physics.ox.ac.uk/rtaylor/images/hot%20carrier%20poster.pdf, date unknown.

Hofer, U., "Self-Trapping of Electrons at Surfaces", Science, vol. 279, No. 5348, Issue of Jan. 9, 1998, pp. 190-191.

Katz, G. et al., "A theoretical study of hole induced desorption", Journal of Chemical Physics, Oct. 22, 1999, vol. 111, Issue 16, pp. 7593-7598.

Lee, B. C. et al., "Transmission of longitudinal optical phonons through a barrier in uniaxial crystals", Physical Review B, vol. 65, 153315, Apr. 15, 2002.

Nanolite, "Nanolite Sparkflashlamp", http://www.hsps/com/products/nanolaen.htm, date unknown.

Nienhaus, H., "Electronic excitations by chemical reactions on metal surfaces", Surface Science Reports, 45, (2002), pp. 1-78.

Plihal, M. et al., "Role of intra-adsorbate Coulomb correlations in energy transfer at metal surfaces", Physical Review B, Jul. 15, 1998, vol. 58, Issue 4, pp. 2191-2206.

Pontius, N. et al., "Size-dependent hot-electron dynamics in small Pd-clusters", Journal of Chemical Physics, Dec. 8, 2001, vol. 115, Issue 22, pp. 10479-10483.

Prybyla, J. A. et al., "Femtosecond time-resolved surface reaction: Desorption of CO from Cu(111) in <325 fsec", Physical Review Letters, Jan. 27, 1992, vol. 68, Issue 4, pp. 503-506.

Rinnemo, M., "Catalytic Ignition and Kinetic Phase Transactions", http://www2.lib.chalmers.se/cth/diss/doc/9596/RinnemoMats.html, date unknown.

Saalfrank, P. et al., "Quantum dynamics of bond breaking in a dissipative environment: Indirect and direct photodesportion of neutrals from metals", J. Chem. Phys. 105 (6), Aug. 8, 1996, pp. 2441-2454.

Sung,-Y.-E., et al., "Enhancement of electrochemical hot electron injection into electrolyte solutions at oxide-covered tantalum electrodes by thin platinum films", Journal of Physical Chemistry B.. vol. 102. No. 49. Dec. 3, 1998. pp. 9806-9811.

White, J. M., "Using photons and electrons to drive surface chemical reactions", Journal of Molecular Catalysis: A: Chemical 131, 1998, pp. 71-90.

Zhdanov, V.P. et al., "Substrate-mediated photoinduced chemical reactions on ultrathin metal films", Surface Science, vol. 432 (#3), pp. L599-L603, Jul. 20, 1999.

Zhu, X.-Y., "Surface photochemistry: from hot reactions to hot materials", Surface Science, vol. 390, (1997), pp. 224-236.

Frese, K.W. Jr. et al., "Methanol Oxidation at p-Si/Pt Electrodes, Evidence for Hot Hole Reactivity", J. Phys. Chem., Jan. 24, 1995, pp. 6074-6083, vol. 99, No. 16.

Frese, K.W., Jr. et al., "Analysis of Current/Voltage Curves at n-Si/SiO2/Pt Electrodes", J. Electrochem. Soc., Dec. 1994, pp. 3375-3382, vol. 1421, No. 12.

"Electron-hole pair creation by reactions at metal surfaces", downloaded from www.aps.org/meet/CENT99/BAPS/abs?S6980001.html American Physical Society Centennial Meeting Program, Atlanta, GA. Mar. 20-26, 1999.

"Electron-Hole Pair Creation at Ag and Cu Surfaces by Adsorption of Atomic Hydrogen and Deuterium", Physical Review Letters, vol. 82, No. 2. Jan. 11, 1999.

Harrison, P. et al., The Carrier Dynamics of Far-Infrared Intersubband Lasers and Tunable Emitters, Institute of Microwaves and Photonics, University of Leeds, U.K., pp. 1-64, date unknown.

Weber, et al., to X2 Electron Transfer Times in Type-II GaAs/A1As Superflattices Due to Emission of Confined and Interface Photons, Superlattices and Microstructures, vol. 23, No. 2 (1998).

Fann, W.S. et al., Electron Thermalization in Gold, Physical Review B, Brief Reports, vol. 46, No. 20, (1992).

Ultrafast Surface Dynamics Group, Time-Resolved Two-Photon Photoemission (TR-2PPE), http://www.llp.physik.unl-essen.de/aeschlimann/2y_photo.htm, date unknown.

Lewis et al., Vibrational Dynamics of Molecular Overlayers on Metal Surfaces, Dept. of Chemistry, University of Pennsylvania, http://lorax.chem.upenn.edu/molsurf/cucotalk/html, date unknown.

Rettner et al., Dynamics of the Chemisorption of 02 on Pt(111): Dissociation via Direct Population of a Molecularly Chemisorbed Precursor at High Incidence Kinetic Energy, The Journal of Chemical Physics, vol. 94, Issue 2 (1991).

Friedman et al., SiGe/Sl THz Laser Based on Transitions Between Inverted Mass Light-Hole and Heavy Hole Standards, Applied Physics Letters, vol. 78, No. 4 (2001).

Harrison et al., Population -Inversion and Gain Estimates for a Semiconductor TASER, date unknown.

Harrison et al., Theoretical Studies of Subband Carrier Lifetimes n an Optically Pumped Three-Level Terahertz Laser, Superlattices and Microstructures, vol. 23, No. 2 (1998).

Harrison et al., Room Temperature Population Inversion in SiGe TASER Designs, IMP, School of Electronic and Electrical Engineering, The University of Leeds, date unknown.

Sun et al., Pheonon-Pumped Terhertz Gain in n-Type GaAs/AlGaAs Superlattices, Applied Physic Letters, vol. 7, No. 22 (2001).

Altukhov et al., Towards Si1-xGex Quantum-Well Resonant-State Terahertz Laser, Applied Physics Letters, vol. 79, No. 24 (2001).

Sun et al., Intersubband Lasing Lifetimes of SiGe/Si and GaAs/AlGaAs Multiple Quantum Well Structures, Applied Physics Letters, vol. 66, No. 25 (1995).

Sun et al., Phonon Pumped SiGe/Si Interminlband Terahertz Laser, date unknown.

Soref et al., Terhertz Gain in a SiGe/Si Quantum Starcase Utilizing the Heavy-Hole Inverted Effective Mass, Applied Physics Letters, vol. 79, No. 22 (2001).

Aeschlimann et al., Competing Nonradative Channels for Hot Electroni Induced Surface Photochemistry, Chemical Physics 202, 127-141 (1996).

Auerbach, Daniel J., Hitting the Surface-Softly, Science, vol. 294, pp. 2488-2489 (2001).

Badescu et al., Energetics and Vibrational States for Hydrogen on Pt(111), Physical Review Letters, vol. 88, No. 13 (2002).

Balandin et al., Effect of Phonon Confinement on the Thermoelectric Figure of Merit of Quantum Wells, Journal of Applied Physics, vol. 64, No. 11 (1998).

Bartels et al., Coherent Zone-Folded Longitudinal Acoustic Phonons in Semiconductor Superlattices: Excitation and Detection, Physical Review Letters, vol. 82, No. 5 (1999).

Baumberg et al., Ultrafast Acoustic Phonon Ballistics In Semiconductor Heterostructers, Physical Review Letters, vol. 78, No. 17 (1997).

Bedurftig et al., Vibrational and Structural Properties of OH Adsorbed on Pt(111), Journal of Chemical Physics, vol. 111, No. 24 (1999).

Valden et al., Onset of Catalytic Activity of Gold Clusters on Titania with the Appearance of Nonmetallic Properties, Science, vol. 281 (1998).

Bondzie et al., Oxygen Adsorption on Well-Defined Gold Particles on TiO2(110), J. Vac. Sci. Technol. A17(4) (1999).

Bezant et al., Intersuband Relaxatin Lefetimes in p-GaAs/AlGaAs Quantum Wells Below theLO-Ohonon Energy Measured in a Free Electron Laser Experiment, Semicond. Sci. Technol. 14 (1999).

Brako et al., Interaction of CO Molecules Adsorbed on Metal Surfaces, Vacuum 61,89-93 (2001).

Burgi et al., Confinement of Surface State Electronis in Fabry-Perot Resonators, Physical Review Letters, vol. 81, No. 24, (1998).

Burgi et al., Probing Hot-Electron Dynamics at Surfaces with a Cold Scanning Tunneling Microscope, Physical Review Letters, vol. 82, No. 22 (1999).

Chang, Y.M., Interaction of Electron and Hold Plasma with Coherent Longitudinal Optical Phonons in GaAs, Applied Physics Letter, vol. 80, No. 14, (2002).

Chang et al., Observation of Coherent Surface Optical Phonon Oscillations by Time-Resolved Surface Second-Harmonic Generation, Physical Review Letters, vol. 78, No. 24 (1997).

Chang et al., Coherent Phonon Spectroscopy of GaAs Surfaces Using Time-Resolved Second-Harmonic Generation, Chemical Physcis 251, 283-308 (2000).

Chang et al. Observation of Local-Interfacial Optical Phonons at Buried Interfaces Using Time-Resolved Second Harmonic Generation, Physical Review B, vol. 59, No. 19 (1999).

Chen et al., Stimulate-Emission-Induced Enhancement of the Decay Rate of Longitudinal Optical Phonons in III-V Semiconductorsi Applied Physics Letters, vol. 80, No. 16 (2002).

Corcelli et al., Vibrational Energy Pooling in CO and NaCl(100): Methods, Journal of Chemical Physics, vol. 116, No. 18 (2002).

Fierz et al., Time-Resolved 2-Photon Photoionization on Metallic Nanoparticles, Appl. Phys. B 68 (1999); http://www.ilp.physik.uni-essen.de/aeschlimann/abstratct.htm#6.

Bezant et al., Intersubband Relaxation Lifetimes in p-GaAs/AlGaAs Quantum Wells Below the LO-Phonon Energy Measured in a Free Electron Laser Experiment, Semicond. Sci. Technol. 14 No. 8 (1999).

Bondzie et al., Oxygen Adsorption on Well-Defined Gold Particles on TlO2(110), Journal of Vacuum Science & Technology A: Vacuum, Surfaces and Films, vol. 17, Issue 4, pp. 1717-1720 (1999).

Harrison et al, Maximising the Population Inversion, by Optimizing the Depopulation Rate, in Far-Infared Quantum Cascade Lasers (2001).

Harrison et al., The Carrier Dynamics of Terahertz Intersubband Lasers, Some Publishing Company (1999).

Fann et al., Electron Thermalization in Gold, Physical Review B, vol. 46, No. 20 (1992).

Cummings et al., Ultrafast Impulsive Excitation of Coherent Longitudinal Acoustic Phonon Oscillations in Highly Potoexcited InSb, Applied Physics Letters, vol. 79, No. 6 (2001).

Chiang, T.C., Photoemission Studies of Quantum Well States in Thin Films, Surface Science Reports 39, pp. 181-235 (2000).

Debernardi et al., Anharmonic Phonon Lifetimes in Semiconductors from Density-Functional Perturbation Theory, Physical Review Letters, vol. 75, No. 9 (1995).

Davis et al., Kinetics and Dynamics of the Dissociative Chemisorption of Oxygen on Ir(111), J. Chem. Phys. 109 (3) (1997).

Choi et al., Ultrafast Carrier Dynamics in a Highly Excited GaN Epilayer, Physical Review B., Vo. 63, 115315 (2001).

Diekhoner et al., Parallel Pathways in Methanol Decomposition on PT(111), Surface Science 409, pp. 384-391 (1998).

Demidenko et al., Piezoelectrically Active Acoustic Waves Confined in a Quantum Well and Their Amplification by electron Drift, Semiconductor Physics, Quantum Electronics & Optoelectronis, vol 3, No. 4, pp. 427-431 (2000).

de Paula et al., to X2 Electron Transfer Times in Type-II Superlattices Due to Emission of Confined Phonons, Appl. Phys. Lett. 65 (10) (1994).

de Paula et al., Carrier Capture via Confined Phonons in GaAs-AlGaAs Multiple Quantum Wells, Selcond, Sci. Technol. 9, pp. 730-732 (1994).

Demidenko et al., Amplification of Localized Acoustic Waves by the Electron Drift in a Quantum Well, Semiconductor Physics, Quantum Electronics & Optoelectronics, vol. 2, No. 1, pp. 11-24 (1999).

Demidenko et al., Generation of Coherent Confined Acoustic Phonons by Drifting Electrons in Quantum Wire; Semiconductor Physics, Quantum Electronics & Optoelectronics, vol. 3, No. 4, pp. 432-437 (2000).

Denzler et al., Surface Femtochemistry; Ultrafast Reaction Dynamics Driven by Hot Electron Mediated Reaction Pathways, World Scientific (2001).

Fatti et al., Temperature-Dependent Electron-lattice Thermalization in GaAs, Physical Review B, vol. 59, No. 7 (1999).

Anastassakis et al., The Physics of Semiconductors, vol. 2, World Scientific (1990).

de Paula et al., Carrier Capture Processes in Semiconductor Superlattices due to Emission of confined Phonons, J. Appl. Phys. 77 (12) (1995).

Engstrom et al., Comparing the Vibrational Properties of Low-Energy Modes of a Molecular and an Atomic Adsorbate: CO and O on Pt(111), Journal of Chemical Physics, vol. 112, No. 4 (2000).

Glavin et al., Generation of High-Frequency Coherent Acoustic Phonons in a Weakly Coupled Superlattice, Applied Physics Letters, vol. 74, No. 23 (1999).

Friedman, SiGe/Si Thz Laser Based on Transitions Between Inverted Mass Light-Hole and Heavy-Hole Subbands, Applied Physics Letters, vol. 78, No. 4 (2001).

Ermoshin et al., Vibrational Energy Relaxation of Adsorbate Vibrations: A theoretical Study of the H/Si(111) System, J. Chem. Phys. 105 (20) (1996.

Glavin et al., Acoustic Phonon Generation in A Superlattice Under the Hopping Perpendicular Transport, United Nations Educational Scientific and Cultural Organization and International Atomic Energy Agency (1998).

Gergen et al., Chemically Induced Electronic Excitations at Metal Surfaces, Science, vol. 294 (2001).

Hagston et al., Simplified Treatment of Scattering Processes in Quantum Well Structures, Journal of Applied Physics, vol. 90, No. 3 (2001).

Harrison et al., Room Temperature Population Inversion in SiGe TASER designs, date unknown.

Harrison et al. The Carrier Dynamics of Terhertz Intersubband Lasers, Some Publishing Company (1999).

Harrison et al., Population-Inversion and Gain Estimates for a Semiconducor Taser, date unknown.

Harrison et al., Theoretical studies of Subband Carrier Lifetimes in an Optically Pumped Three-Level Terahertz Laser, Superlattices and Microstructures, vol. 23, No. 2 (1998).

Harrison et al., The Carrier Dynamics o Far-Infared Intersubband Lasers and Tunable Emitters, www.ee.leeds.ac.uk/homes/ph/, date unknown.

Hess et al., Hot Carrier Relaxation by Extreme Electron-LO Phonon Scattering in GaN, date unknown.

Hohlfeld et al., Electron and Lattice Dynamics Following Optical Excitation of Metals, Chemical Physics 251, pp. 237-258 (2000).

Huang et al., Vibrational Promotion of Electron Transfer, Science, vol. 290 (2000).

Kawakami et al., Quantum-well States in Copper Thin Films, Nature, vol. 398 (1999).

Kohler et al., Enhanced Electron-Phonon Coupling at the Mo and W (110) Surfaces Induced by Adsorbed Hydrogen, miri-th/9510004 (1995).

Lewis et al., Continuum Elastic Theory of Adsorbate Vibrational Relaxation, J. Chem. Phys. 108 (3) (1998).

Lewis et al., Controlling Adsorbate Bivrational Lifetimes Using Superlattices, Physical Review B, vol. 63, 085402 (2001).

Komirenko, Sergly M., Phonons and Phonon-Related Effects in Prospective Nanoscale Semiconductor Devices (2000).

Huang et al., Observation of Vibrational Excitation and Deexcitation for NO(v=2) Scattering from Au(111): Evidence for Electron-Hole-Pair Mediate Energy Transfer, Physical Review Letters, vol. 84, No. 13 (2000).

Lewis et al, Substrate-Adsorbate Coupling In Co-Adsorbed Copper, Physical Review Letters, vol. 77, No. 26 (1996).

Krauss et al., Coherent Acoustic Phonons in a Semiconductor Quantum Dot, Physical Review Letters, vol. 79, No. 25 (1997).

Lugli et al., Interaction of Electrons with Interface Phonons in GaAs/AlAs and GaAs/AlGaAs Heterostructures,Semicond. Sci. Technol. 7 (1992).

Nienhaus et al., Electron-Hole Pair Creation at Ag and Cu Surfaces by Adsorption of Atomic Hydrogen and Deuterium, Physical Review Letters, vol. 82, No. 2 (1999).

Mulet et al., Nanoscale Radiative Heat Transfer Between a Small Particle and a Plane Surface, Applied Physics Letters, vol. 78, No. 19 (2001).

Nienhaus et al., Direct Detection of Electron-Hole Pairs Generated by Chemical Reactions on Metal Surfaces, Surface Science 445, pp. 335-342 (2000).

Nienshaus, Hermann, Electronic Excitations by Chemical Reactions on Metal Surfaces, Surface Science Reports 45, pp. 1-78 (2002).

Nolan et al., Translational Energy selection of Molecular Precursors to Oxygen Adorption on Pt(111), Physical Review Letters, vol. 81, No. 15 (1998).

Nienhaus et al., Selective H Atom Sensors Using Ultrathin Ag/Si Schottky Diodes, Applied Physics Letters, vol. 74, No. 26 (1999).

Nolan et al., Molecularly Chemisorbed Intermediates to Oxygen Adsoprtion on Pt(111): A Molecular Beam and Electron Energy-Loss Spectroscopy Study, Journal of Chemical Physics, vol. 111, No. 8 (1999).

Nolan et al., Direct Verification of a High-Translational-Energy Molecular Precursor to Oxygen Dissociation on Pd(111), Surface Science 419 (1998).

Ogawa et al., Optical Intersubband Transitions and Femtosecond Dynamics in Ag/Fe(100) Quantum Wells, Physical Review Letters, vol. 88, No. 11 (2002).

Plihal et al., Role of Intra-Adsorbate Coulomb Correlations in Energy Transfer at Metal Surfaces, Physical Review B, vol. 58, No. 4 (1998).

Paggel et al., Quantum-Well States as Fabry-Perot Modes in a Thin-Film Electron Interferometer, Science, vol. 283 (1999).

Paggel et al., Quasiparticle Lifetime in Macroscopically Uniform Ag/Fe(100) Quantum Wells, Physical Review Letters, vol. 81, No. 25 (1998).

Paggel et al., Quantum Well Photoemission from Automically Uniform Ag Films: Determination of Electronic Band Structure and Quasi-Particle Lifetime in Ag(100) Applied Surface Science 162-163, pp. 78-85 (2000).

Persson et al., A First-Principles Potential Energy Surface for Eley-Rideal Reaction Dynamics of H Atoms on Cu(111), Journal of Chemical Physics. vol. 110, No. 4 (1999).

Ozgur et al., Control of Coherent Acoustic Phonons in InGaN Multiple Quantum Wells, arXlv:cond-mat/0010170 (2000).

Stanton et al., Energy Relaxation by Hot Electrons In n-GaN Epilayers, Journal of Applied Physics, vol. 89, No. 2 (2001).

Stipe et al., Atomistic Studies of O2 Dissociation on Pt(111) induced by Photons, Electrons and by Heating, J. Chem. Phys. 107 (16) (1997).

Sun et al., Phonon Pumped SiGe/Sl Interminiband Terahertz Laser, pp. 1-11, date unknown.

Soref et al., Terahertz Gain in a SiGe/Si Quantum Staircase Utilizing the Heavy-Hole Inverted Effective Mass, Applied Physics Letters, vol. 79, No. 22 (2001).

Qu et al., Long-Lived Phonons, Physical Review B, vol. 48, No. 9 (1993).

Pontius, et al., Size-Dependent Hot-Electron Dynamics in Small Pdn-Clusters, Journal of Chemical Physics, vol. 115, No. 22 (2001).

Smit et al., Enhanced Tunneling Across Nanometer-Scale Metal-Semiconductor Interfaces, Applied Physics Letters, vol. 80, No. 14 (2002).

Qiu et al., Long-Distance and Damping of Low-Frequency Phonon Polariton in LINbO3, Physical Review B, vol. 56, No. 10 (1997).

Rousse et al, Non-Thermal Melting in Semiconductors Measured at Femtosecond Resolution, Nature, vol. 410 (2001).

Schelling et al., Phonon Wave-Packet Dynamics at Semiconductor Interfaces by Molecular-Dynamics Simulation, Applied Physics Letters, vol. 80, No. 14 (2002).

Shikin et al., Phase Accumulation Model Analysis of Quantum Well Resonances Formed in Ulta-Thin Ag, Au Films on W(110), Surface Science (2001).

Snow et al., Ultrathin PtSi Layers Paterned by Scanned Probe Lithography, Applied Physics Letters, vol. 79, No. 8 (2001).

Prabhu et al., Femtosecond Energy Relaxation of Nonthermal Electrons Injected in p-doped GaAs Base of a Heterojunction Bipolar Transistor, Journal of Applied Physics, vol. 90, No. 1 (2001).

Tsai et al., Theoretical Modeling of Nonequilibrim Optical Phonons and Electron Energy Relaxation in GaN, Journal of Applied Physics, vol. 85, No. 3 (1999).

Tripa et al., Surface-Aligned Photochemistry: Aiming Reactive Oxygen Atoms Along a Single Crystal Surface, Journal of Chemical Physics, vol. 112, No. 5 (2000).

Tripa et al., Surface-Aligned Reaction of Photogenerated Oxygen Atoms with Carbon Monoxide Targets, Nature, vol. 398 (1999).

Tripa et al., Kinetics Measurements of CO Photo-Oxidation on Pt(111), J. Chem. Phys. 105 (4) (1996).

Taylor et al., Strong Electron-LO Phonon Scattering and Hot Carrier Relaxatin in GaN, Abstract No. ba249KW3, date unknown.

Sun et al., Phonon-Pumped Terahertz Gain in n-Type GaAs/AlGaAs Superlattices, Applied Physics Letters, vol. 78, No. 22 (2001).

Tom et al., Coherent Phonon and Electron Spectroscopy on Surfaces Using Time-Resolved Second-Harmonic Generation, date unknown.

Tiusan et al., Quantum Coherent Transport Versus Diode-Like Effect in Semiconductor-Free Metal/Insulator Structure, Applied Physics Letters, vol. 79, No. 25 (2001).

Stromquist et al., The Dynamics of H Absorption in and Adsorption on Cu(111, Surface Science 397, pp. 382-394 (1998).

Tsai et al., Theoretical Modeling of Nonequilibrium Optical Phonons and Electron Energy Relaxation In GaN, Journal of Applied Physics, vol. 85, No. 3 (1999).

Weber et al., Carrier Capture Processes In GaAs-AlGaAs Quantum Wells Due to Emission of Confiend Phonons, Appl. Phys. Lett. 63 (22) (1993).

Wintterlin et al., Atomic and Macroscopic Reaction Rates of a Surface-Catalyzed Reaction, Science, vol. 278 (1997).

Yeo et al., Calorimetric HEats for CO and Oxygen Adsorptin and for the Catalytic CO Oxidation Reaction on Pt{111}, J. Chem. Phys. 106 (1) (1997).

Witte et al., Low Frquency Vibrational Modes of Adsorbates, Surface Science, No. 1362 (2002).

Valden et al., Onset of Catalytic Activity of Gold Clusters on Titania with The Appearance of Nonmetallic Properties, Science, vol. 281 (1998).

Xu et al., Electrical Generation of Terahertz Electromagnetic Pulses by Hot-Electrons in Quantum Wells, Superlattices and Microstructures, vol. 22, No. 1 (1997).

Wanke et al., Injectorless Quantum-Cascade Lasers, Applied Physics Letters, vol. 78, No. 25 (2001).

Zhdanov, Vladimir P., Nm-Sized Metal Particles on a Semiconductor Surface, Schottky Model, etc., Surface Science, SUSC 2931 (2002).

Yeo et al., Calorimetric Investigation of No and O adsorptin on Pd(100) and the Influence of Preadsborbed Caron, J. Chem. Phys. 106 (5) (1997).

Zambelli et al., Complex Pathways in Dissociative Adsorption of Oxygen on Platinum, Nature, vol. 390 (1997).

Zhdanov et al., Substrate-Mediated Photoinduced Chemical Reactions on Ultrathin Metal Films, Surface Science 432 (1999).

Altukhov et al., Towards Si1-xGex Quantum-well Resonant-State Terahertz Laser, Applied Physics Letters, vol. 79, No. 24 (2001).

Friedman et al., SiGe/Si THz Laser Based on Transitions Between Inverted Mass Light-Hole and Heavy-Hole Subbands, Applied Physics Letters, vol. 78, No. 4 (2001).

Harrison et al., The Carrier Dynamics of Terahertz Intersubband Lasers, Some Publishing Company (1999).

Harrison et al., The Carrier Dynamics of Far-Infared Intersubband Lasers and Tunable Emitters, www.ee.leeds.ac.uk/homes/ph/, date unknown.

Harrison et al., Room Temperature Populatin Inversion in SiGe TASER Designs, date unknown.

Harrison et al., Population-Invension and Gain Estimates for a Semiconductor TASER, date uknown.

Sun et al., Phonon Pumped SiGe/Si Interminiband Terahertz Laser, date uknown.

Sun et al., Intersubband Lasing Lifetimes of SiGe/Si and GaAs/AlGaAs Multiple Quantum Well Structures, Appl. Phys. Letter 66 (25) (1995).

Sun et al., Phonon-Pumped Terhertz GaIn in n-Type GaAs/AlGaAs Superlattices, Applied Physics Letters, vol. 78, No. 22 (2001).

Albano et al., Adsorption-Kinetics of Hot Dimers, SciSearch Databaseof the Institute for Scientific Information (1999).

Casassa et al., Time-Resolved Measurements of Vibrational Relaxatin of Molecules on surfaces: Hydroxyl Groups on Silica Surfaces, Journal of Vacuum Science & Technology A; Vacuum, Surfaces, and Films, vol. 3, Issue 3 (1985).

Cavanagh et al., Vibrational Relaxation of Adsorbed Molecules: Comparison with Relaxation Rates of Model Compunds, Journal of Vacuum Science & Technology A: Vacuum, Surfaces and Films, vol. 5, Issue 4 (1987).

Hyh et al., Methanol Oxidation of Palladium Compared to Rhodium at Ambient Pressures as Probed by Surface-Enhanced Ramen and Mass Spectroscopies, Journal of Catalysis, vol. 174 (2) (1998).

Gumhalter et al., Effect of Electronic Relaxation on Covalent Adsorption Reaction Rates, Physical Review B, vol. 30, Issue 6 (1984).

Nolan et al., Surface Science, Direct Verification of a High-Translational-Energy Molecular Precursor to Oxygen Dissociation on Pd(111), Surface Science, vol. 419 (1998).

Phihal et al., Role of Intra-Adsorbate Coulomb Correlations in Energy Transfer at Metal Surfaces, Physical Review B, vol. 58, Issue 4 (1998).

Tully et al., Electronic and Phonon Mechanisms of vibrational Relaxation: CO on Cu(100), J. Vac. Sci. Technol. A 11(4) (1993).

DiMatteo et al., Enhanced Photogeneration of Carriers in a Semocnductor Via Coupling Across a Nonisothermal Nonascale Vacuum Gap, Applied Physics Letters, vol. 79, Issue 12 (2001).

Yates et al., Special Adsorption and Reaction Effects at Step Defect Sites on Platinum Single Crystal Surfaces (2000).

Dekorsy et al, Coherent Acoustic Phons in Semiconductor Superlattics, phys. stat. sp;. (b) 215, p. 425-430 (1999).

Auerbach, Daniel J.; "Hitting the Surface-Softly"; Science, 294, (2001), pp. 2488-2489.

Bondzie, V.A., et al.;; "Oxygen adsorption . . . gold particles . . . TiO2(110)"; J. Vac. Sci. Tech. A., (1999) 17, pp. 1717 and figure 3.

Boulter, James; "Laboratory Measurement of OH . . . "; http://pearll.lanl.gov/wsa2002/WSA2002talks.pdf, date unknown.

Chan H.Y.H., Methanol Oxidation On Palladium Compared To Rhodium . . . ; J. Catalysis v. 174(#2) pp. 191-200 (1998) (abstract and figure 1 only).

Chiang, T.-C. ; Photoemission studies of quantum well states in thin films; Surf. Sci. Rpts.39 (2000) pp. 181-235.

Chubb, D. L., et al; "Semiconductor Silicon as a Selective Emitter"; http://www.thermopv.org/TPV-2-05-Chubb.pdf (abstract only), date unknown.

Corcelli, S. A., et al.; "Vibrational energy pooling in CO on NaCl(100) . . . "; J. Chem. Phys.(2002) 116, pp. 8079-8092.

Danese, A., et al.; "Influence of the substrate electronic structure on metallic quantum well . . . "; Prog. Surf. Sci., 67, (2001), pp. 249-258.

Davis, J. E., et al.; "Kinetics and dynamics of the dissociative chemisorption of oxygen on Ir(111)"; J. Chem. Phys. 107 (3), (1997), pp. 943-952.

Diekhoner, L., et al.; "Parallel pathways in methanol . . . Pt(111)"; Surf. Sci. 409 (1998) pp. 384-391.

Diesing, D., et al.; "Aluminuum oxide tunnel junctions . . . "; Thin Solid Films, vol. 342 (1-2) (1999) pp. 282-290.

Dimatteo, R. S., et al.; "Enhanced photogeneration of carriers . . . vacuum gap"; Appl. Phys. Let. (2001) 79, pp. 1894-1896.

Dimatteo, R. S., et al.; "Introduction to and Experimental Demonstration of Micron-gap ThermoPhotoVoltaics"; http://www.termopv.org/37DiMatteo.html (abstract only), date unknown.

Dogwiler, Urs, et al.; "Two-dimensional . . . catalytically stabilized . . . lean methane-air . . . "; Combustion and Flame, (1999), 116(1,2), pp. 243-258.

Echenique, P. M. , et al.; "Surface-state electron dynamics in noble metals"; Prog. Surf. Sci., 67, (2001), pp. 271-283.

Endo, Makoto, et al.; "Oxidation of methanol . . . on Pt(111) . . . "; Surf. Sci. 441 ( 1999) L931-L937, Surf. Sci. Letters.

Fan, C. Y., et al.; "The oxidation of CO on RuO2 . . . "; J. Chem. Phys. 114, (2001), pp. 10058-10062.

Fann, W.S. , et al.; "Electron thermalization in gold"; Phys. Rev. B (1992) 46 pp. 13592-13595.

Gee, Adam T., et al.; "The dynamics of O2 adsorption on Pt(533) . . . "; J. Chem. Phys.(2000) 113, pp. 10333-10343.

Gergen, Brian, et al.; "Chemically Induced Electronic Excitations at Metal Surfaces"; Science,294, (2001) pp. 2521-2523.

Guliants, Elena A, et al.; "A 0.5-μm-thick polycrystalline silicon Schottky . . . "; Appl. Phys. Let., (2002), 80, pp. 1474-1476.

Gumhalter, B., et al.; "Effect of electronic relaxation . . . adsorption reaction rates"; Phys. Rev. B (1984) 30 pp. 3179-3190.

Halonen, Lauri, et al.; "Reactivity of vibrationally excited methane on nickel . . . "; J. Chem. Phys.(2001) 115, pp. 5611-5619.

Hasegawa, Y., et al.; Modification of electron . . . standing wave . . . Pd . . . ; Surf. Sci., in press, Apr. 11, 2002.

Henry, Claude R.; "Catalytic activitiy . . . nanomater-sized metal clusters"; Applied Surf. Sci., 164, (2000) pp. 252-259.

Hess, S., et al.; "Hot Carrier Relaxation . . . Phonon Scattering in GaN"; http://www.physics.ox.ac.uk/rtaylor/images/hot%20carrier%20poster.pdf, date unknown.

Ho, Wilson; http://www.lassp.cornell.edu/lassp_data/wilsonho.html, date unknown.

Hohlfeld, J, et al.; "Electron and lattice dynamics . . . optical excitation of metals"; Chemical Physics, 251 (2000) pp. 237-258.

Honkala, Karoliina, et al.; "Ab initio study of O2 precursor states on the Pd(111) . . . "; J. Chem. Phys. (2001) 115, pp. 2297-2302.

Hou, H. ; Y., et al.; "Chemical Interactions of Super-Excited Molecules on Metal Surfaces"; http://www2.chem.ucsb.edu/~wodtke/papers/danl.pdf, date unknown.

Hou, H., et al.; "Direct multiquantum relaxation of highly vibrationally excited NO . . . "; J. Chem. Phys., 110, (1999) pp. 10660-10663.

Huang Y., et al.; "Observation of Vibrational Excitation and Deexcitation for NO from Au(111) . . . "; Phys. Rev. Lett., 84, (2000) pp. 2985-2988.

Huang, Yuhui, et al.; "Vibrational Promotion of Electron Transfer"; SCIENCE, vol. 290, Oct. 6, 2000, pp. 111-113.

IBH; "NanoLED overview"; http://www.ibh.co.uk/products/light_sources/nanoled_main.htm, date unknown.

IBH; "Red picosecond laser sources"; http://www.ibg.co.uk/products/light_sources/nanoled/heads/red_laser_heads.htm, date unknown.

Iftimia, Ileana, et al.; "Theory . . . scattering of molecules from surface"; Phys. Rev. B (2002) 65, Article 125401.

Ishikawa, Yasuyuki, et al.; "Energetics of H20 dissociation and COads+OHads reaction . . . Pt . . . "; Surf. Sci. preprints SUSC 12830, Apr. 27, 2002.

Johnson, R. Colin ; "Molecular substitution . . . terahertz switch arrays"; EE Times, (Apr. 10, 2000, 3:35 p.m. EST) http://www.eet.com/story/OEG20000410S0057.

Kao, Chia-Ling, et al. "The adsorption . . . molecular carbon dioxide on Pt(111) and Pd(111)"; Surf. Sci., (2001) Article 12570.

Katz, Gil, et al.; "Non-Adiabatic Charge Transfer Process of Oxygen on metal Surfaces"; Surf. Sci 425(1) (1999) pp. 1-14.

Kawakami, R. K., et al.; "Quantum-well states in copper thin films"; Nature, 398, (1999) pp. 132-134.

Komeda, T., et al.; "Lateral Hopping of Molecules Induced by Excitation of Internal Vibration . . . "; Science, 295, (2002) pp. 2055-2058.

Lewis, Steven P., et al.; "Continuum Elastic Theory of Adsorbate Vibrational Relaxation"; J. Chem. Phys. 108, 1157 (1998).

Lewis, Steven P., et al.; "Substrate-adsorbate coupling in CO-adsorbed copper"; Phys. Rev. Lett. 77, 5241 (1996).

Li, Shenping, et al.; "Generation of wavelength-tunable single-mode picosecond pulses . . . "; Appl. Phys. Let. 76, (2000) pp. 3676-3678.

Mitsui, T., et al.; "Coadsorption and Interactions of O and H on Pd(111)"; Surf. Sci., Article 12767, (2002).

Moula, Md. Golam, et al.; "Velocity distribution of desorbing CO2 in CO oxidation on Pd(110) . . . "; Applied Surf. Sci., 169-170, pp. 268-272 (2001).

Mulet, Jean-Philippe, et al.; "Nanoscale radiative heat transfer between a small particle . . ."; Appl. Phys. Let., 78, (2001) p. 2931.

Nienhaus, H, et al.; "Direct detection of electron-hole pairs generated by chemical reactions on metal surfaces"; Surf. Sci. 445 (2000) pp. 335-342.

Nienhaus, H. ; "Electronic excitations by chemical reactions on metal surfaces"; Surf. Sci. Rpts. 45 (2002) pp. 1-78.

Nienhaus, H., et al.; "Selective H atom sensors using ultrathin Ag/Si Schottky diodes"; Appl. Phys. Let. (1999) 74, pp. 4046-4048.

Nienhaus, Hermann; "Electron-hole pair creation by reactions at metal surfaces"; APS, Mar. 20-26, 1999, Atlanta, GA, Session SC33 [SC33.01].

Nienhaus, H, et al.; "Electron-Hole Pair Creation at Ag and Cu . . . of Atomic Hydrogen and Deuterium"; Phys. Rev. Lett., 82, (1999) pp. 446-449.

Nolan P.D., et al.; "Direct verification of . . . precursor to oxygen dissociation on Pd(111)"; Surf. Sci. v. 419 (#1) pp. L107-L113, (1998).

Nolan, P. D., et al.; "Molecularly chemisorbed intermediates to oxygen adsorption on Pt . . . "; J. Chem. Phys. 111, (1999), pp. 3696-3704.

Nolan, P. D., et al.; "Translational . . . Precursors to Oxygen Adsorption on Pt(111)"; Phys. Rev. Lett., 81, (1998) pp. 3179-3182.

Ogawa, S., et al.; "Optical . . . and Femtosecond Dynamics in Ag/Fe(100) Quantum Wells"; Phys. Rev. Lett. 88, 116801 (2002).

Paggel, J. J., et al.; "Quantum-Well States as Fabry-Pérot Modes in a . . . "; Science, 283, (1999), pp. 1709-1711.

Paggel, J. J., et al.; "Quasiparticle Lifetime . . . Ag/Fe(100) Quantum Wells"; Phys. Rev. Lett. (1998) 81, pp. 5632-5635.

Paggel, J.J., et al.; "Quantum well photoemission from atomically uniform Ag films . . . "; Applied Surf. Sci., 162-163, (2000), pp. 78-85.

Rettner, C. T. , et al.; "Dynamics . . . chemisorption of O2 on Pt(111) . . . chemisorbed precursor . . . "; J. Chem. Phys. (1991) 94, pp. 1626-1635 (abstract only).

Rinnemo, Mats; "Catalytic Ignition and Kinetic Phase Transitions"; 1996; http://www2.lib.chalmers.se/cth/diss/doc/9596/Rinnemo Mats.html.

Robertson, A. J. B.; "Catalysis of Gas Reactions by Metals"; Logos Press Limited; 1970; LC # 70-80936; pp. 1-5, 10, 41; Great Britain, Adlard & son Ltd.

Schewe, P., et al.; "CO2 Production at the Single-Molecule Level"; http://www.aip.org/enews/physnews/2001/split/561-1.html, 2001.

Sheng, H. , et al.; "Schottky diode with Ag on (110) epitaxial ZnO film"; Appl. Phys. Let. (2002) 80, pp. 2132-2134.

Smit, G. D. J., et al.; "Enhanced tunneling across nanomater-scale metal-semiconductor interfaces"; Appl. Phys. Let.(2002) 80, pp. 2568-2570.

Snow, E. S., et al.; "Ultrathin PtSi layers patterned by scanned probe lithography"; Appl. Phys. Let. (2001) 79, pp. 1109-1111.

Stipe, B. C., et al.; "Atomistic studies of O2 dissociation on Pt(111) induced by photons . . . "; J. Chem. Phys., (1997) 107 pp. 6443-6447.

Sun C.-K., et al.; "Femtosecond studies of carrier dynamics in InGaN"; Appl. Phys. Let. (1997) 70 pp. 2004-2006.

Svensson, K., et al.; "Dipole Active Vibrational Motion in the Physisorption Well"; Phys. Rev. Lett., 78, (1997) pp. 2016-2019.

Tarver, Craig M. ; "Non-Equilibrium Chemical Kinetic . . . Explosive Reactive Flows"; Fall 1999 IMA Workshop: High-Speed Combustion in Gaseous and Condensed-Phase.

Taylor, R.A., et al.; "Strong Electron-LO Phonon Scattering and Hot Carrier Relaxation in GaN"; http://www.physics.ox.ac.uk/rtaylor/images/ha249kw3.pdf, date unknown.

Teodorescu, C.M., et al.; "Structure of Fe layers grown on InAs . . . "; Appl. Surf. Sci., 166, (2000) pp. 137-142.

Tiusan, C., et al.; "Quantum coherent transport versus diode-like effect in . . . "; Appl. Phys. Let. 79, (2001) pp. 4231-4233.

Tripa, C. Emil, et al.; "Surface-aligned photochemistry: Aiming reactive oxygen atoms . . . "; J. Chem. Phys., (2000) 112 pp. 2463-2469.

Tripa, C. Emil, et al.; "Surface-aligned reaction of photogenerated oxygen atoms with . . . "; Nature 398, pp. 591-593 (1999).

Tripa, C. Emil; "Special Adsorption and Reaction Effects at Step Defect Sites on Platinum . . . "; http://www.chem.pitt.edu/thesis.html#tripa (abstract only), date unknown.

Volkening, S., et al.; "CO oxidatin on Pt(111)—Scanning tunneling microscopy experiments . . . "; J. Chem. Phys. (2001) 114, pp. 6382-6395.

Watson, D.T.P., et al.; "Isothermal and temperature-programmed oxidation of CH over Pt . . . "; Surf. Sci. preprint, year 2001.

Watson, D.T.P., et al.; "Surface products of the dissociative adsorption of methane on Pt . . . "; Surf. Sci. prepting, c Oct. 2001.

Wilke, Steffen, et al.; "Theoretical investigation of water formation on Rh and Pt Surfaces"; J. Chem. Phys., 112, (2000) pp. 9986-9995.

Wintterlin, J, et al.; "Atomic . . . Reaction Rates . . . Surface-Catalyzed . . . "; Science, 278, (1997) pp. 1931-1934.

Wintterlin, J, R., et al.; "Existence of a "Hot" Atom Mechanism for the Dissociation of O2 on Pt(111)"; Phys. Rev. Lett., 77, (1996), pp. 123-126.

Zambelli, T., et al.; "Complex pathways in dissociative adsorption of oxygen on platinum"; Nature 390, pp. 495-497 (1997).

Zhdanov, V.P., et al.; "Substrate-mediated photoinduced chemical reactions on ultrathin metal films"; Surf. Sci., V. 432 (#3) pp. L599-L603, (1999).

Zhdanov, Vladimir P.; "Nm-sized metal particles on a semiconductor surface, Schottky . . . "; Surf. Sci. PROOF SUSG 2931, Apr. 20, 2002.

Zhukov, V. P., et al.; "Lifetimes of quasiparticle excitations in 4d transition metals . . . "; Phys. Rev. B (2002) 65, Article 115116.

Daniel J. Auerbach, Hitting the Surface Softly, www.sciencemag.org, vol. 294 Science, Dec. 21, 2001, pp. 2488-2489.

M.D. Cummings and A. Y Ele Zzabi, Ultarfast impulsive excitation of coherent longitudinaL acoustic phonon oscillations in highly photoexcited InSb, 2001 American Institute of Physics, vol. 79, No. 6, Aug. 6, 2001.

J.W. Gadzuk, Resonance-Assisted Hot Electron Femotochemistry at Surfaces; National Institute of Standards and Technology, Gathersburg, Maryland 20899, Physical Review Letters, vol. 76, No. 22, May 27, 1996.

Brian Gergen, Herman Nienhaus,W., Henry Weinberg, Eric W. McFarland, Chemically Induced Electronic Excitations at Metal Surfaces, www.sciencemag.org, vol. 294, Dec. 21, 2001, pp. 2521-2523.

H.Hou, Y.Huang, S.J. Guilding, C.T Rettner, D.J. Auerbach, A.M. Woodtke, Enhanced Reactivity of Highly Vibrationally Excited Molecules on Metal Surfaces, www.sciencemag.org, vol. 284, Jun. 4, 1999, pp. 1647-1650.

Y.Huang,C.T Rettner, D.J. Auerbach, A.M. Woodtke, Vibrational Promotion of Electron Transfer, sciencemag.org, vol. 290, Oct. 6, 2000, pp. 111-114.

Steven p. Lewis , Andrew M. Rappe, Controlling adsobate vibrational lifetimes using superlattices, 2001 The American Physical Society, Physical Review B, Bolume 63, 085402.

Henry Weinberg, Eric W. McFarland, A. Majumdar, B. Gergen, Herman Nienhaus,W.,H.S Bergh, Electron-Hole Pair Creation at Af and Cu Surfaces by Adsorption of Automic Hydrogen and Deuterium, 1999 The American Physical Society, Physical Review Letters, vol. 82.

Henry Weinberg, Eric W. McFarland, A. Majumdar, B. Gergen, Herman Nienhaus, W.,H.S Bergh, Direct detection of electron-hole pairs generated by vhemical reactions on metal surfaces, 2000 Elsevier Science B.V., Surface Science, pp. 335-342.

Xiaofeng, Fan, Gehong, Chris Labounty, and Bowers, John E., Croke, Edward, Ahn, Channing C., Huxtable, Scott, Majumdar, Arun, Shakouri, Ali; SiGec/Si superlattice microcoolers; Applied Phusics Letters, vol. 78, No. 11, Mar. 12, 2001, pp. 1580-1582.

Friedman, L., Sun G., Soref, R.A.; SiGec/Si THz laser based on transitions between inverted mass light-hole and heavy-hole subbnads; Applied Physics Lettera1, vol. 78, No. 4, Jan. 22, 2001; p. 401-403.

Harrison, P., Soref, R.A.; Population-inversion and gain estimates for semiconductor TASER, date unknown.

Harrison, P., Soref, R.A.; Room temperature population inversion in SiGe TASER design, date unknown.

Hohlfeld, J., Wellershoff, S.-S, J., Gudde, U., Conrad, V., Jahnke, E., Mattias; Electron and lattice dynamics folowing optical excitation of metals; Chemical Physics 251(2000), p. 237-258.

Hou, H., Huang, Y., Goulding, S.J., Retter., C.T., Auerbach, D.J., Wodrke, A.M.; Dierect multiquantum relaxation of highly vibrationally excited NO in collisions with O/Cu(111); Journal of Chemical Physics vol. 110 (22) p. 10660, (1999).

Jongma, Rienk T., Wodtke, Alec M.; Fast multiquantum vibrational relaxation of highly vibrationally excited O2; Journal of Chemical Physics; vol. 111, No. 24; Dec. 22, 1999; pp. 10957-10963.

Kawakami, R.K., Rotenberg, E., Choi, Hyuk J., Escorcia-Aparicio, Ernesto J., Bowen, M.O., Wolfe, J.H., Arenholz, E., Zhang, Z.D., Smith, N.V., Qiu, Z.Q., Quantum-well states in copper thin films; Letters to nature; vol. 398; Mar. 11, 1999; www.nature.com.

MD. Golam Moula, Surgio Wako, Gengyu Cao, Ivan Kobal, Yuichi Ohno, Tatsuo Matsushima; Velocity distribution of desorbin CO2 in CO oxidation ion Pd(110) under steady-state conditions; applied surface science; 169-170 (2001); pp. 268-272.

Jean-Philippe Mulet, Karl Joulain, Remi Carminati, and Jean-Jacques Greffet; Nanoscale radiative heat transfer between a small particle and a plane surface; Applied Physics Letters; vol. 78, No. 19; May 7, 2001; pp. 2931-2933.

H. Niehaous et al., "Direct detection of electron-hole pairs generated by chemical reaction on metal surfaces", Surface Science 445 (2000), pp. 3350342.

H. Niehaus et al., "Selective H atom sensors using ultrathin Ag/Si Schottky diodes", Applied Physics Letters, vol. 74, No. 26, Jun. 28, 1999, pp. 4046-4048.

J J Paggel et al., "Quantum-Well States as a Fabry-Perot Modes in a Thin-Film Electron Interferometer", www.Sciencemag.org Science vol. 284, Mar. 12, 1999, pp. 1709-1711.

J.J. Paggel et al., "Quasiparticle Lifetime in Macroscopically Uniform Ag/Fe (100) Quantum Wells", Physics Review Letters, vol. 81, No. 25, Dec. 21, 1998, pp. 5632-5635.

J.J Paggel et al., Quantum well photoemission from automatically uniform Ag films: determination of electronic band structure and quasi particle lifetime in Ag (100), Aplied Surface Science 162-163(2000), pp. 78-85.

N. Pontius et al.,"Size-dependent hot-electron dynamics in small Pdn-cluster", Journal of Chemical Physics, vol. 115, No. 22, Dec. 8, 2001, pp. 10479-10483.

R. A. Sorel et al., Terahertz gain in a SiGe/Si quantum staircase utilizing the heavy-hole inverted effective mass, Applied Phusics Letters, vol. 79, No. 22, Nov. 26, 2001, pp. 3639-3641.

G. Sun et al., Phonon-pumped terahertz gain in n-type GaAs/AlGaAs Superlattices, Applied Physics Letters, vol. 78, No. 22, pp. 3520-3522, May 28, 2001.

V. P. Zhdanov et al., "Substrate-mediated photoinduced chemical reactions on ultrathin metal films", Surface Sciene 432 (1999), pp. L599-L603.

H. Park et al., "Nanomechanical oscillations in a single-C60 transistor", Letters to nature, vol. 407, Sep. 7, 2000, www.nature.com, pp. 57-60.

G. Sun et al., "Phonon Pumped SiGe/Si Interminiband Terahertz Laser", pp. 1-11, date unknown.

G. Sun et al., "Phonon-pumped terahertz gain in n-type GaAs/Al GaAs superlattices", Applied Physics Letters, vol. 78, No. 22, May 28, 2001, pp. 3520-3522.

K. Svensson et al., "Dipole Active Vibrational Motion in the Physisorption Well", Physical Review Letters, vol. 78, No. 10, Mar. 10, 1997, pp. 2016-2019.

R. D. Vale et al., "The Way Things Move: Looking Under the Hood of Molecular Motor Proteins", Science, vol. 288, Apr. 7, 2000, www.sciencemag.org, pp. 88-95.

W. Xu et al., Electrical generation of terahertz electromagnetic pulses by hot-electrons in quantum wells, Superlattices and Microstructures, vol. 22, Nov. 1, 1997, pp. 25-29.

G. Sun, R.A. Soref, J.B. Khurgin; "Phonon Pumped SiGe/Si Interminiband Terahertz Laser", date unknown.

P. Armour et al., "Hot-electron transmission through metal-metal interfaces: a study of Au/Fe/Au trilayers in GaAs substrates", Applied Surface Science 123/124 (1998), pp. 412-417.

C.D. Bezant et al., "Intersubband relaxation lifetimes in p-GaAs/AlGaAs quantum wells below the LO-phonon energy measured in a free electron laser experiment", Vacuum Solutions Online, Semicond. Sci. Technol. 14 No. 8 (Aug. 1999) L25-L28, PU: SO268-1242(99)03699-X.

L. Burgi et al., "Confinement of Surface State Electrons in Fabry-Perot Resonators", Physical Review Letters, vol. 81, No. 24, Dec. 14, 1998, pp. 5370-5373.

I. Campillo et al., "Inelastic lifetimes of hot electrons in real metals", Physical Review Letters, vol. 83, No. 11, Sep. 13, 1999, pp. 2230-2233.

Chiang, T.-C., "Photoemission studies of quantum well states in thin films", Surface Science Reports 39 (2000) pp. 181-235.

De Paula, A. et al, "Carrier capture processes in semiconductor superlattices due to emission of confined phonons", J. Appl. Phys. 77 (12), 1995 pp. 6306-6312.

"The Solarex Guide to Solar Electricity" Solarex Corporation, Inc. Frederich, MD, pp. 66-67, Apr. 1979.

Ree, J. et al., "Dynamics of Gas-Surface Interactions: Reaction of Atomic Oxygen with Chemisorbed Hydrogen on Tungsten," Journal of Physical Chemistry, vol. 101 (#25), pp. 4523-4534, Jun. 19, 1997.

Ree, J. et al., "Reaction of atomic oxygen with adsorbed carbon monoxide on a platinum surface," Journal of Chemical Physics, vol. 104, Issue 2, pp. 742-757, Jan. 8, 1996.

Nolan, P.D. et al., "Molecularly chemisorbed intermediates to oxygen adsorption on Pt(111): A molecular beam and electron energy-loss spectroscopy study," Journal of Chemical Physics, vol. 111, No. 8, pp. 3696-3704, Aug. 22, 1999.

Nolan, P. D. et al., "Translation Energy Selection of Molecular Precursors to Oxygen Adsorption on Pt (111)," Physical Review Letters, vol. 81, No. 15, pp. 3179-3182, Oct. 12, 1998.

Murphy, M. J. et al., "Inverted vibrational distributions from $N_2$ recombination at Ru(001): Evidence for a metastable molecular chemisorption well," Journal of Chemical Physics, vol. 110, No. 14, pp. 6954-6962, Apr. 8, 1999.

Kim, M. S. et al., "Reaction of Gas-Phase Atomic Hydrogen with Chemisorbed Hydrogen Atoms on an Iron Surface," Bull. Korean Chem. Soc., vol. 18, No. 9, pp. 985-994, May 22, 1997.

Bonn, M. et al., "Phonon-Versus Electron-Mediated Desorption and Oxidation of CO on Ru(0001)," Science, vol. 285, pp. 1042-1045, Aug. 13, 1999. www.sciencemag.org.

Nolan, P. D. et al., "Direct verification of a high-translational-energy molecular precursor to oxygen dissociation on Pd(111)," Surface Science Letters, vol. 419, pp. L107-L113, Sep. 24, 1998.

Davis, J. E. et al., "Kinetics and dynamics of the dissociative chemisorption of oxygen on Ir(111)," Journal of Chem. Phys., vol. 107(3), pp. 943-952, Jul. 15, 1997.

Tripa, C. Emil et al., "Surface-aligned reaction of photo-generated oxygen atoms with carbon monoxide targets," Nature, vol. 398, pp. 591-593, Apr. 15, 1999, www.nature.com Shin HK, "Vibrationally excited OD Radicals from the Reaction of Oxygen-Atoms with Chemisorbed Deuterium on Tungsten," Journals of Physical Chemistry, vol. 102 (#13), pp. 2372-2380, Mar. 26, 1998.

Tripa, C. Emil et al., "Kinetics measurements of CO photo-oxidation on Pt(111)," Journal of Chemical Physics, vol. 105, Issue 4, pp. 1691-1696, Jul. 22, 1996.

Tripa, C. E. et al., "Kinetics measurements of CO photo-oxidation on Pt(111)," J. Chem. Phys., vol. 105, No. 4, Jul. 22, 1996, pp. 1691-1696, especially the disclosure beneath the paragraph header "C. Cross section determination methods" on p. 1693.

Nolan, P. D. et al., "Molecularly chemisorbed intermediates to oxygen adsorption on Pt(111): A molecular beam and electron energy-loss spectroscopy study," J. Chem. Phys., vol. 111, No. 8, Aug. 22, 1999, pp. 3696-3707, especially figure 9 and the desorption of figure 9 set forth on p. 3702, 2nd full paragraph et seq.

Ree, J. et al., "Reaction of atomic oxygen with adsorbed carbon monoxide on a platinum surface," J. Chem. Phys., vol. 104, No. 2, Jan. 8, 1996, pp. 742-757, particularly the abstract and p. 753.

Diesing, D. et al., "Aluminum oxide tunnel junctions: influence of preparation technique, sample-geometry and oxide thickness," Thin Solid Films 342 (1999), pp. 282-290, received Feb. 26, 1998; accepted Sep. 11, 1998.

G.H. Takaoka et al., "Preparation and catalytic activity of nanoscale Au islands supported on TiO2" Nuclear Instruments & Methods in Physics Research, Section B: Beam Interactions with Materials and Atoms, North-Holland Publishing Company, Amsterdam, NL, vol. 121, No. 1, 1997, pp. 503-506; XP004057973, abstract.

P. Avouris et al., "Electron-Simulated Catalysis Device", IBM Technical Disclosure Bulletin, vol. 25, No. 12, May 1, 1983, pp. 6378-6379, New York, US, XP002219954.

Frese, et al., "Analysis of Current/Voltage Curves at n-Si/SiO$_2$/Pt Electrodes", J. Electrochem. Soc., Dec. 1994, pp. 3375-3382, vol. 141, No. 12, The Electrochemical Society, Inc.

Frese, et al., "Methanol Oxidation at p-Si/Pt Electrodes, Evidence for Hot Hole Reactivity", J. Phys. Chem., 1995, pp. 6074-6083, vol. 99, American Chemical Society.

Gadzuk, "Multiple Electron Processes in Hot-Electron Femtochemistry at Surfaces", http://www.cstl.mist.gov/div837/837.03/highlite/gadzuk1999.htm.

Frese, et al., "Hot Electron Reduction at Etched n-Si/Pt Thin Film Electrodes", J. Electrochem. Soc., Sep. 1994, pp. 2402-2409, vol. 103, The Electrochemical Society Inc.

Gaillard, et al., "Hot Electron Generation in Aques Solution at Oxide-Covered Tantalum Electrodes, Reduction of Methylpyridinium and Electrogenerated Chemiluminescence of Ru(bpy)$_3^{2+}$", J. Phys. Chem., 1999, pp. 667-674, vol. 103, American Chemical Society.

Sung, et al., "Demonstration of Electrochemical Generation of Solution-Phase Hot Electrons at Oxide-Covered Tantalum Electrodes by Direct Electrogenerated Chemiluminescence", J. Phys. Chem., 1998, pp. 9797-9805, vol. 102, American Chemical Society.

Zhdanov, et al., "Substrate-mediated photoinduced chemical reactions on ultrathin metal fims", Surface Science, 1999, pp. L599-L603, vol. 432, Elsevier Science B.V.

Frese, K. W., Jr. et al., "Hot electron reduction at etched n-Si/Pt thin film electrodes," Journal of the Electrochemical Society, vol. 141, No. 9, Sep. 1994, pp. 2402-2409.

Mahan, G. D. et al., "Multilayer thermionic refrigerator and generator," Journal of Applied Physics, vol. 83, No. 9, May 1, 1998.

Stipe, B. C. et al., "Atomistic studies of O2 dissociation on Pt(111) induced by photons, electrons, and by heating," J. of Chem. Phys., vol. 107 (16), Oct. 22, 1997, pp. 6443-6447.

Tripa, C. E. et al., "Surface-aligned reaction of photogenerated oxygen atoms with carbon monoxide targets," Nature, vol. 398, Apr. 15, 1999, pp. 591-593.

Bonn, M. et al., "Phonon-Versus Electron-Mediated Desorption and Oxidation of CO and Ru(0001)," Science, vol. 285, No. 5430, Issue or Aug. 13, 1999, pp. 1042-1045.

Davis, J. E. et al., "Kinetics and dynamics of the dissociative chemisorption of oxygen on Ir(111)," J. Chem. Phys., 107 No. 3, Jul. 15, 1997, pp. 943-951.

Gadzuk, J. W., "Hot-electron femtochemistry at surfaces: on the role of multiple electron processes in desorption," Chemical Physics, vol. 251, year 2000, pp. 87-97.

Gadzuk, J. W., "Resonance-assisted hot electron femtochemistry at surfaces," Physical Review Letters, May 27, 1996, vol. 76, Issue 22, pp. 4234-4237.

GE, N.-H. et al., "Femtosecond Dynamics of Electron Localization at Interfaces," Science, vol. 279, No. 5348, Issue of Jan. 9, 1998, pp. 202-205.

Gao, Shiwu, "Quantum kinetic theory of vibrational heating and bond breaking by hot electrons," Physical Review B, vol. 55, No. 3, Jan. 15, 1997-I, pp. 1876-1886.

Hou, H. et al., "Enhanced Reactivity of Highly Vibrationally Excited Molecules on Metal Surfaces," Science, vol. 284 No. 5420, Issue of Jun. 4, 1999, pp. 1647-1650.

Nienhaus, H. et al., "Direct detection of electron hole pairs generated by chemical reactions on metal surfaces," Surface Science 445 (2000) pp. 335-342.

Nienhaus, H. et al., "Selective H atom sensors using ultrathin Ag/Si Schottky diodes," Applied Physics Letters, Jun. 28, 1999, vol. 74, Issue 26, pp. 4046-4048.

Gaillard, Frederic et al., "Hot electron generation in aqueous solution at oxide-covered tantalum electrodes. Reduction of methylpyridinum and electrogenerated chemiluminescence of Ru)bpy)32+," Journal of Physical Chemistry B., vol. 103, No. 4, Jan. 28, 1999, pp. 667-674.

Engstrom, Ulrika and Ryberg, Roger, "Comparing the vibrational properties of low-energy modes of a molecular and an atomic adsorbate: CO and O on Pt (111)," Journal of Chemical Physics, vol. 112, No. 4, Jan. 22, 2000, pp. 1959-1965.

Nolan, P. D. et al., "Molecularly chemisorbed intermediates to oxygen adsorption on Pt ( 111 ): A molecular beam and electron energy-loss spectroscopy study," Journal of Chemical Physics, vol. 111, No. 8, Aug. 22, 1999.

Nolan, P. D. et al., "Direct verification of a high-translational-energy molecular precursor to oxygen dissociation on Pd(111)," Surface Science vol. 419, pp. L107-L113, Dec, 24, 1998.

Otto, Andreas et al., "Role of atomic scale roughness in hot electron chemistry," Journal of Physical Chemistry B, vol. 103, No. 14. Apr. 8, 1999, pp. 2696-2701.

Plihal, M. et al., "Role of intra-adsorbate Coulomb correlations in energy transfer at metal surfaces," Physical Review B, vol. 58, No. 4, Jul. 15, 1998, pp. 2191-2206.

Sung, Yung-Eun et al., "Enhancement of electrochemical hot electron injection into electrolyte solutions at oxide-covered tantalum electrodes by thin platinum films," Journal of Physical Chemistry B., vol. 102, No. 49, Dec. 3, 1998, pp. 9806-9811.

Zhdanov, V. P. et al., "Substrate-mediated photoinduced chemical reactions on ultrathin metal films," Surface Science, vol. 432 (#3), pp. L599-L603, Jul. 20, 1999.

Nienhaus, H., "Electron-hole pair creation by reactions at metal surfaces," American Physical Society, Centennial Meeting Program, Mar. 20-26, 1999, Atlanta, GA, Session SC33—Metal Surfaces: Adsorbates. http://www.aps.org/meet/CENT99/BAPS/.

Nienhaus, H et al., "Electron-Hole Pair Creation at Ag and Cu Surfaces by Adsorption of Atomic Hydrogen and Deuterium," Physical Review Letters, vol. 82, Issue 2, Jan. 11, 1999, pp. 446-449.

Diesing, D. et al., "Aluminium oxide tunnel junctions: influence of preparation technqiue, sample geometry and oxide thickness," Thin Solid Films, 342 (1999), pp. 282-290, received Feb. 26, 1998; accepted Sep. 11, 1998.

Agranovich, V. M. et al., "New concept for organic LEDs: non-radiative electronic energy transfer from semiconductor quantum well to organic overlayer", Elsevier Science, Synthestic Metals, 2001, vol. 116, pp. 349-351.

Steinbrüchel et al., "Energy Dissipation in Catalysis", University of Minnesota, August 1973, pp. 267-270.

Schonnhammer et al., "Energy Dissipation at Metal Surfaces: Electronic Versus Vibration Excitations," Journal of Electron Spectroscopy and Related Phenomena. (1983) p. 93-101.

Prieur et al., "Sound Amplification by Stimulated Emission of Radiation in an Amorphous Compound," Europhysics letters, 24 (5) (1993), pp. 409-414.

Zavtrok et al., "SASER (Sound Amplification by Stimulated Emission of Radiation)," Apr. 1997, pp. 406-414.

Surowiak et al., "Structure and Certain Physical Properties of BaTiO3 Thin Films with Diffused Phase Transition," XP-002355326, 1 page, date unknown.

Taylor et al., "Phonon Focusing in Solids," Jun. 1969, pp. 416-420.

Tobias et al., "Fast chemical Sensing with Metal insulator Silicon Carbide Structures," Jun. 1997, pp. 287-289.

Lloyd Spetz et al., "High Temperature Sensors Based on Metal-Insulator-Silicon Carbide Devices," Jan. 1997, pp. 493-511.

Benson, "Sodium chemiluminescence in the Na+N20 and Na-catalyzed N20+CO Reactions," Sep. 1976, pp. 3879-3885.

* cited by examiner

PULSED ELECTRON JUMP GENERATOR

CROSS REFERENCE TO RELATED APPLICATIONS

This is a continuation-in-Part of application Ser. No. 09/589,669 filed Jun. 7, 2000, now U.S. Pat. No. 6,327,859. which is a divisional application of application Ser. No. 09/304,979 filed May 4, 1999, now U.S. Pat. No. 6,114,620.

BACKGROUND OF THE INVENTION

The present invention relates generally to converting energy into useful forms, and particularly, to converting energy into useful forms by stimulating high peak reaction rates of short duration in chemical reactions in a regional volume.

A method to convert chemical energy into electricity uses chemical reactions such as fuel-air reactions to create non-equilibrium concentrations of highly vibrationally excited products. When those products migrate to a conducting surface, the products may generate hot electrons in the surface. When the conducting surface is sufficiently thin, a form of semiconductor device may collect the hot electrons and convert them into electricity.

Another method to convert chemical energy into electricity uses chemical reactions such as a fuel-air reaction to create photon radiation with energies characteristic of the reaction temperatures. Because the photon energies of typical reaction temperatures lie within the range of photovoltaic semiconductor converters, photons may be converted into electricity using photovoltaic means. A portable thermo-photovoltaic power source is described in the U.S. Pat. No. 5,593,509.

The efficiency of a known device that stimulates reactions increases with the temperature of the device. The efficiency of the device to collect and convert the reactants to electricity, however, decreases sharply as the operating temperature increases beyond ambient temperature, which for typical semiconductors is about 300 to 400 degree Kelvin.

It is, therefore, highly desirable to operate an energy collecting and converting device at an ambient temperature while operating the chemical reactions that generate vibrationally excited specie at the maximum possible temperature and reaction rate.

Pulsed chemical reactions cause maximum reaction rate and permit a device, e.g., a semiconductor device, to operate up to its highest allowable operating temperature. The thermal mass of the semiconductor delays and minimizes significant heating. During the period of time between pulses, also referred to as a dead time, the energy collecting device may dissipate the heat generated during the pulsed reaction time and peak power portion of the reaction-collection cycle.

Therefore, it is also desirable to have pulsed chemical reactions that generate the highest possible peak power and peak reaction rates to produce hot electrons.

A problem associated with pulsed chemical reactions is initiating and sustaining the reactions. The problem becomes more severe when the reaction occurs near a surface, e.g., a conducting surface, and the reaction is confined to a small volume, e.g., when dimensions of the confining volume are the order of a micron or less.

In a typical reaction chamber, the energy of reactions is contained in and by the gas and contributes to sustaining the reaction above ignition. In such chambers, the reaction is sustained or maintained in part because reaction intermediates called autocatalysts are created and consumed by the reaction.

In a small reaction region, however, sustaining or maintaining the reaction becomes problematic. For example, in a small reaction region, any electromagnetic energy generated radiates promptly out of the small reaction region because of the extremely high surface to volume ratio of the small, micron-size region. Further, translational and vibrational energy of autocatalysts and reaction products created as a result of the reactions is quickly dissipated upon contact with the reaction chamber walls. The energy generated in smaller volumes, therefore, do not contribute significantly to sustaining the reaction.

In small reaction volumes, e.g., with dimensions in the order of one micron, the burst of reactions is a transient phenomenon that is extinguished when the reactions deplete the autocatalysts. These auto-catalysts, which are generated during the reaction, play a key role in sustaining the reaction. One micron is the size of approximately two diffusion lengths for vibrationally excited byproducts of a typical fuel-air reaction during their 10 nanoseconds lifetime after initiation. The vibrationally excited species thermalize during this time. This diffusion length is typically longer than the translational mean free path and is a function of the lifetime of the vibration state.

Fast depletion of the energy of reaction tends to extinguish the reaction. Reactions such as fuel-oxidizer reactions are maintained by the creation of autocatalysts. The autocatalysts are consumed by reaction with the fuel and oxidizer and are produced as a result of the reactions. Keeping or raising the gas temperature above the ignition temperature serves to create the autocatalysts.

The autocatalyst are typically free radicals that are known to sustain a reaction and rapidly drive the reaction to completion. Therefore, it would be advantageous to have a method to insert the autocatalysts into the reacting mixture. By introducing more autocatalysts in the reaction, the reaction can be sustained beyond its natural tendency to deplete energy and become extinguished.

The byproducts of a reaction in the small reaction region are initially created in highly vibrationally excited states of gas molecules. It has been observed that vibrationally excited species may collide between hundreds or thousands of times with other specie in the gas before the energy is dissipated into the gas, such as into translation and rotation modes. If, e.g., a vibrationally excited state would take about 100 collisions to thermalize, the lifetime would be in the order of 10 nanoseconds. When such vibrationally excited species diffuse through the gas and contact a metal surface, it has been demonstrated that they may transfer a major fraction of their energy during a single collision with the surface and in the form of a hot electron. This electron energy transfer may also take away energy from the reaction in the small reaction region forming a micro volume, and deny the reaction the energy needed to maintain the temperature of reaction. Instead, the energy denied to the reaction is transferred to the surface.

These forms of transferred energy, e.g., radiation and hot electrons, may be collected using semiconductor devices. The same semiconductor devices may also convert the energy into more useful forms such as electricity.

It is well known that the reaction surface chemical reactivity increases almost exponentially with increase in temperature. It would be highly desirable to have only the reaction surface reach the high temperature, so that only minimum amount of heat is used to raise the reaction surface temperature.

It is also desirable to have the thinnest possible reaction surface that switches to a high temperature for a short duration, and to have the reaction surface reach this temperature when the reactants are in contact with the reaction surface. Further, to efficiently stimulate and generate energy, it is desirable to concentrate the energy used to heat the reaction surface into pulses. Yet further, it is desirable to initiate reactions in pulses.

Molecules collide with the device's surface and also produce a pulse of heat. This pulse of heat, injected into the device surface, is transient and therefore, the device may dissipate the heat into the device's volume over time. In this way, the device operates at its average temperature, not the peak temperature of the reaction. This mode operation reduces or eliminates high temperature that would normally cause the device to run inefficiently.

A pulse of one electron volt hot electrons lasting under 500 femtoseconds, when injected into a thin metal conductor by any one of many known external means may concentrate the electron energy in the conductor surface electrons as a result of the hot electron transfer. This concentration raises the temperature of the surface electrons to exceed approximately 5,000 Kelvin within approximately one picosecond and forms hot electron gas. The hot electron transfer and the raising of the temperature occur in a conductor having a dimension of order of the diffusion length for 1 eV hot electrons. This diffusion length is in the order of 10 nanometers, which is typically 30 molecular or atomic layers thick.

It has been shown that this hot electron gas may react within picoseconds with any chemicals adsorbed on the surface of the conductor, thereby driving reactions which may even be inaccessible to thermal processes.

It has been shown that the 5,000 Kelvin or hotter electron gas couples to the metal vibrations, also referred to as phonons, to raise the temperature of the phonons to the order of 2,000 Kelvin over a similar dimension of surface and over a time period of 1–3 picoseconds. The phonons move more slowly than the electrons, and therefore dissipate their energy to and equilibrate with the bulk material over time periods typically of order 50 picoseconds.

The result of the hot electron pulse is a metal surface with an effective temperature far exceeding that of the bulk, and advantageously, a reaction surface with activity associated with the peak temperature. This high temperature may persist until the phonons couple the energy to the bulk, i.e., for about 50 picoseconds, which is the time the phonons take to couple their energy to the bulk.

Further, when there is a catalyst surface with temperature exceeding thousands of degrees Kelvin, adsorbates on that surface may promptly react or dissociate, and free radical specie and translationally hot atoms or molecules may readily and promptly desorb into the region near or on the reaction surface. Such free radicals and energetic specie are known to be autocatalytic and necessary for initiating and sustaining chemical reactions, such as combustion.

A known method to create a hot electron pulse in the surface uses femtosecond lasers. While such lasers create a short pulse, they are typically laboratory sized and cannot be reduced to micro-chip dimensions.

Flashlamps driven by pulsed electrical discharges are another known way to create and inject free radicals into a reactive chemical mix to initiate reactions. These fast flashlamp methods of causing electrical discharges, however, typically yield pulses no shorter than 5 to 10 nanoseconds, and require kilo-volt initiator and switching systems. Further, the flashlamps will only cause significant hot electron generation in the conductive surface and not in micron-sized volume of reactants. Thus, such flashlamps typically render optical stimulation inefficient.

Therefore, it would be highly desirable to have a method and device that provide a burst of hot electrons into nanometer dimension surfaces efficiently, and during the time before the phonons of the thin reaction surface reach equilibrium with the bulk.

SUMMARY OF INVENTION

The present invention is directed to stimulating pulsed chemical reactions in a micro-volume containing gaseous reactants. A highly useful application includes but is not limited to generating electricity. Other applications include energizing a light emitting diode, energizing a laser diode, electrically energizing a quantum well, energizing a quantum well using phonons, and energizing chemical reactions with transported hot electrons and hot carriers.

In one embodiment, an emitter stimulates the reactions of a fuel-oxidizer mixture and a collector converts the high level of molecular vibrational energy of the resulting products directly into electricity.

The device of the present invention to stimulate and collect energy may be configured in many ways. In one embodiment, the device includes an emitter that stimulates and initiates the reactions in the reactant mix, a reaction region, a collector, and reactants such as fuel and oxidizer.

The emitter acts like a spark plug and may be constructed to be on the same surface as the collector, to be the same physical device as the collector, or to be on the same surface of a contoured surface including the collector. The fuel may be mixed with oxidizer or may be separately injected. The emitter may be insulated from the collector and may be on separate structures distinct from the collector. The reaction region may be completely enclosed or partly enclosed by collectors or it may be open to reactant flow. The reaction region may include the surface of the collector itself. The reactants may adsorb or partially adsorb on the collector and on the emitter. More than one type of fuel or oxidizer may be provided, e.g., one type of fuel mixed with one type of the oxidizer and the other fuel, another oxidizer or mixture separately injected.

In one embodiment, the device is formed on and hewn out of a substrate semiconductor to form both the emitter and the collector. The device includes a collector which includes a diode, an emitter, and a reaction region. In one embodiment, air, including exhausts, is made to flow into and out of the reaction region, and fuel is made to flow into the reaction region. The device may be configured in several geometries, including but not limited to, a V-channel, a box, and a plane.

In one embodiment, to cause the reactivity of reaction surface to switch to its high temperature value and become active, a thin, tens of nanometers or less dimension or thickness of the reaction surface is heated during a pulse. The reaction surface may comprise a catalyst surface. The switching feature permits the choice of catalyst material to include materials not normally considered to be catalysts.

The reaction surface may be part of either or both the emitter and collector. Reactants may "plate-out" in the sense of adsorbing on a reaction surface, thereby concentrating the reactants on a reaction surface. Plate-out may be enhanced by choosing material for the reaction surface with high sticking coefficient for fuel, oxidizer, or both. For example, sticking coefficient in excess of 0.05 may be useful for plate-out. The concentrating may provide conditions for high peak reaction rates and high instantaneous peak power. The adsorbing process includes incomplete adsorption, e.g. adsorption into precursor states.

A sudden onset of high reactivity of the reaction surface causes a sudden production of and to some degree desorption of autocatalytic material, resulting in stimulation of reactions in the gas next to or on the reaction surface. In one embodiment, an initiation is supplied, where the initiation of chemical reaction between fuel and oxidizer is prompt, for example, taking tens of picoseconds, and causes the sudden onset of this high reactivity between fuel and oxidizer.

In one embodiment, a pulse of energy such as hot electrons, photons, or phonons, are created and injected into a thin reaction surface. The pulses may originate as optical or electrical pulses. The duration of the pulse is, e.g., shorter than the time it takes for phonons in the surface in contact with the reactants to equilibrate with the substrate.

In one embodiment, hot electrons are injected into the thin, nanometers-thick conductive layer to heat the electrons of the conductive layer. This method preferentially heats the electrons faster than heating the vibrations of the conductive layer. The vibrations are heat; the heated electrons are useful. This preferential heating of electrons occurs because the heat capacity of electrons is orders of magnitude lower than that of atomic vibrations, so a given energy input heats them orders of magnitude hotter than vibrations.

In one embodiment, the preferential heating of electrons in the conductive layer may be further enhanced by choosing the thickness of the conductive layers to be of the same order of magnitude or less than the energy diffusion parameter of the electrons, which thickness is of order 10 to 50 nanometers.

In one embodiment, chemical reactions produce exhaust products which desorb from reaction surfaces, thereby permitting further chemical reactants to replenish their supply on the surface.

In one embodiment, catalysts accelerate the replenishment of reactants on a reacting surface.

In one embodiment, rapid replenishment of reactants permits sufficient power density to maintain a useful voltage across the collector diode, with associated useful power output. The collector diode may include a Schottky diode or a p-n junction diode.

In one embodiment, the collector may include a unipolar device, such as a quantum well, where excitations such as phonons, longitudinal optical phonons, and electrons, may energize the unipolar device. The reactive surface of such a collector may include materials and practices tailored to cause a predominance of phonons to energize the device or to cause a predominance of electrons to energize it. Such tailoring may include tailoring the quantum well levels. Such tailoring may also include choice of material Debye temperature, the use of superlattices, and tailoring of the phonon and electron band structure of superlattices.

Further features and advantages of the present invention as well as the structure and operation of various embodiments of the present invention are described in detail below with reference to the accompanying drawings. In the drawings, like reference numbers indicate identical or functionally similar elements.

BRIEF DESCRIPTION OF DRAWINGS

Preferred embodiments of the present invention will now be described, by way of example only, with reference to the accompanying drawings in which.

DETAILED DESCRIPTION

Figure 1:
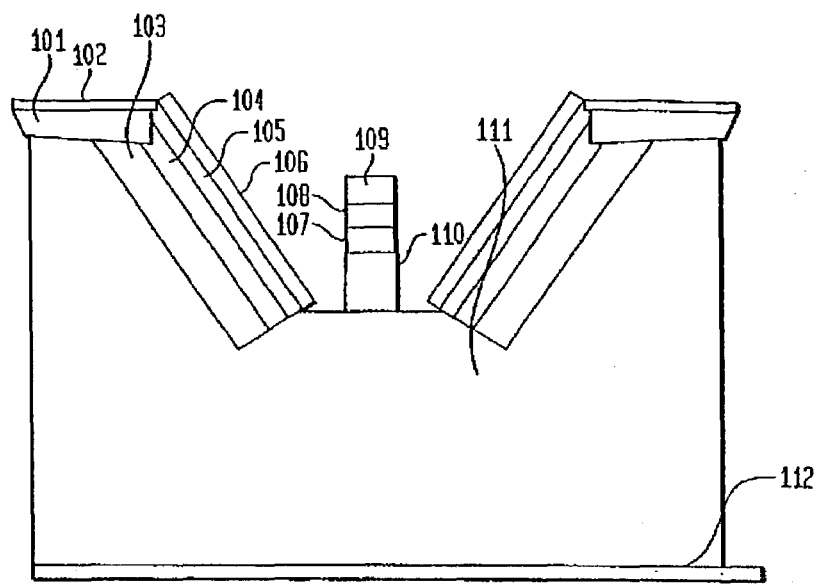
FIG. 1 shows a schematic cross section of a gas-phase-reactant-pulsed electric generator using a reaction stimulator in a V-channel geometry in one embodiment.

FIG. 1 shows a schematic cross section of a gas phase reactant, pulsed electric generator using a reaction stimulator in a V-channel geometry. Fuel and air mixture diffuses into the V-channel from above the V-channel. The emitter includes an electrically-driven hot electron generator, the hot electron generator also being referred to as an injector, such as a metal-insulator-metal (MIM) injector or a metal-semiconductor-metal (MSM) injector. The injector includes an electrode 107 formed on a structure 110, e.g., a heat insulator. In MIM injector a thin tunneling insulator 108 is used to provide hot electrons and a thin reaction surface 109, which also may be an electrode, is activated by the injector 108.

In a MSM version a semiconductor 108 is used to provide hot electrons. A thin reaction surface 109, which also may be an electrode, is activated by the injector 108. The reaction surface and electrode 109 of both versions MSM and MIM may use layers and clusters of catalyst and layers and clusters of insulator or other material arranged on a metal or conducting substrate, shown as a single element 109.

A pulse of hot electrons is created by applying an electric pulse across the injector electrodes 107, 109. This pulse of hot electrons is injected into the thin reaction surface and electrode 109. The duration of the pulse, e.g., is shorter than the time it takes for phonons in the reaction surface 109 to diffuse away from the thin reaction surface 109. This pulse duration is typically less than 50 picoseconds and greater than 10 picoseconds. Electrical pulses, e.g., may be of duration approximately 30 picoseconds to energize an emitter 107, 108, 109. The length of the pulse is an engineering parameter that depends in part on the degree of phonon isolation or impedance mismatch between the reaction layer 109 and substrate injector 108.

In FIG. 1, injector is shown as an insulator layer 108 placed between two electrodes 107, 109. The injector also may be, but is not limited to, any one of the following devices: a forward biased diode, a metal-insulator-metal device, a semiconductor-insulator-metal device, a semiconductor-metal device, an optical device, or a quantum well. These injector devices produce a common effect, i.e., the generation of hot electrons and insertion into a thin reaction surface with, e.g., sufficiently thin dimension to render the hot electrons useful.

The electrically driven forms of the emitter include electrodes such as those shown in 107 and 109, and a reaction surface 109. In one embodiment, the reaction surface 109 and the electrode 109 may be one and the same.

In one embodiment to energize the injector electrodes 107, 109, stored electric charges are switched into or injected into the injector 107, 108, 109. This switching causes a forward bias in the diode or injector, further causing the stored charges, in the form of hot electrons, to be dumped into the thin conductive metal electrode 109 which may also be a reaction surface. These dumped hot electrons desirably heat the electrode 109 and the reaction surface. In FIG. 1, the reaction surface is shown as the same element as the electrode 109.

Figure 7:
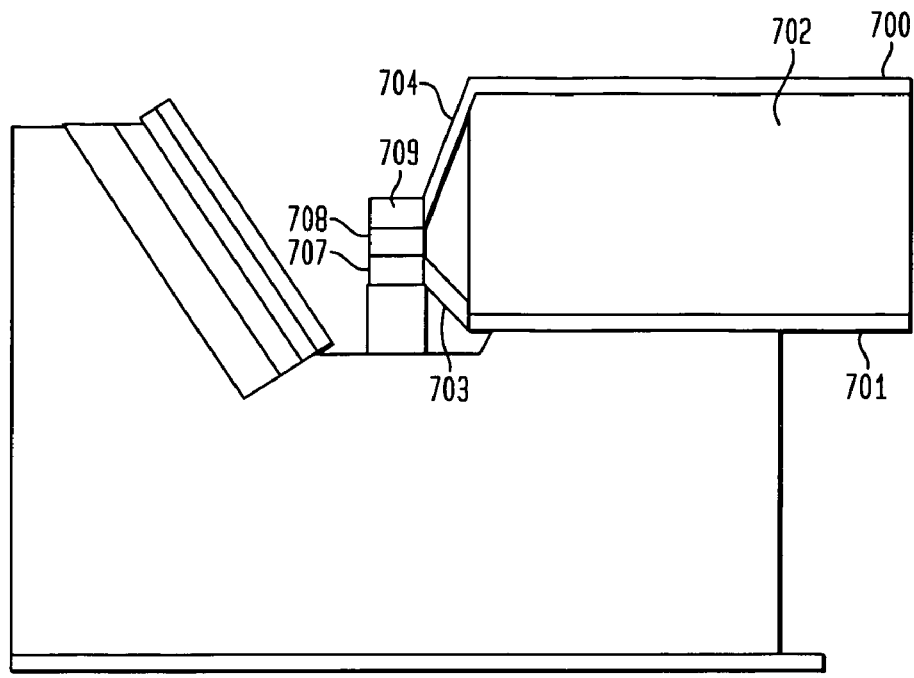
FIG. 7 shows a transmission line used to drive the injector of the device of the present invention in one embodiment.

In one embodiment, the electrical pulse may be achieved by electrically driving a transmission line or strip transmission line, also referred to as a stripline. This is schematically shown in FIG. 7. FIG. 7 shows a stripline superimposed on, e.g., the device of FIG. 1. The electrical pulse is achieved by driving the stripline at one end with an electrical pulse across electrodes 700 and 701. The stripline includes electrodes 700 and 701 and dielectric material 702. The pulse travels from input electrodes 700 and 701 to output electrodes 703 and 704. This stripline is a waveguide. By constructing what is called a dispersive waveguide, by proper choice of dielectric and electrode properties and configurations, a pulse may be narrowed. This transmission line terminates with its electrodes 703 and 704 by connecting to the injector electrodes 707 and 709.

Referring back to FIG. 1, when the hot electron injector is designed to be a tunneling insulator, the dimensions of the tunneling insulator 108 and thin reaction surface 109 are chosen to be of order the same size or less than three times the energy diffusion length of the hot electrons traversing the insulator 108, which dimension is e.g., of order tens of nanometers or less in the metal. The term diffusion length of hot electrons refers to the diffusion length of electrons with the energy appropriate for their use. E.g., a hot 1 eV electron may degrade into several 0.1 eV electrons. The diffusion length for 1 eV electron in a metal is typically shorter than that of 0.1 eV electron. Under some conditions the diffusion length of an electron in a metal scales as the square of energy relative to the Fermi level energy.

In one embodiment, the electrode 109 that receives the hot electrons is formed to be thin with dimensions typically of order less than three diffusion lengths of hot electrons. These electrodes that receive hot electrons may include but are not limited to any one or combination of a diode, a metal-insulator-metal device, a metal layer, a metal layer on a semiconductor, and a quantum well. These variations of emitter configurations describe different ways to create hot electrons and render them useful at a reaction surface.

In another embodiment, optical pulses may be applied to energize the injector. In this case, the injector electrode 107 would not be needed. A similarly thin conductor 109 and an optically thick semiconductor 108 are used to receive optical energy generated by an external optical generator device. Any known optical generator device may be utilized. An electrode formed from the thin conductor 109 on the semiconductor 108 absorbs the optical energy and creates hot electrons. These hot electrons migrate to the reaction surface 109.

In another embodiment, the reaction surface 109 is formed with composites or layers, e.g., an underlayer of conductor with dimension less than two diffusion dimensions for hot electrons, and coated with a similarly thin layer of a desirable catalyst. Any desirable catalyst may be used. Such composites or layers may be in direct contact with the electron injector element (FIG. 1, 107, 108, 109).

Figure 8:
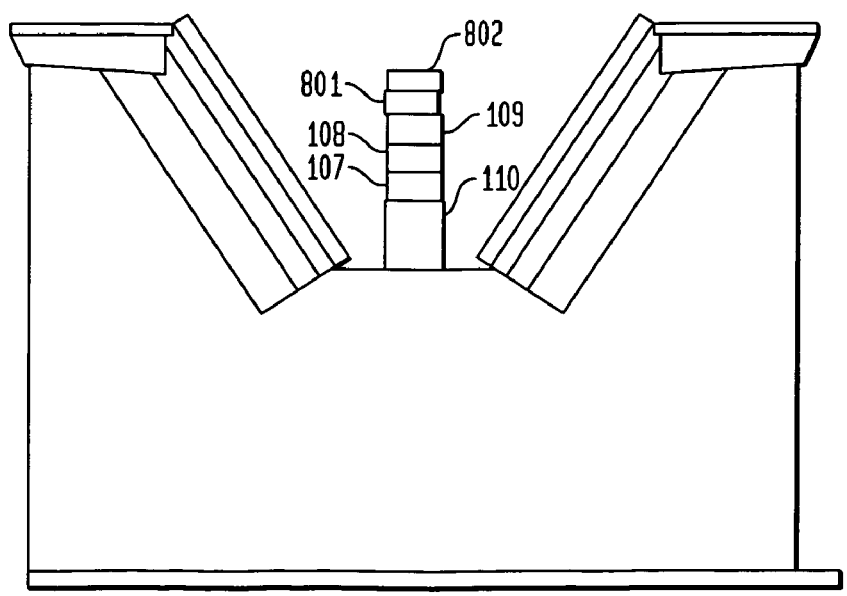
FIG. 8 shows an example of composites placed in direct contact with the injector in one embodiment.

An example of composites placed in direct contact with the injector is shown in FIG. 8. The composite includes a layer of conductor 801 such as $RuO_2$ with average thickness of order 10 nanometers or less, under a catalyst layer such as gold or platinum with thickness about 10 nanometers or less. Another example of catalysts includes an alumina spiked with vanadia or other catalysts. When an electrical pulse of order volts is applied to the electrodes 107 and 109, The fuel and oxygen adsorbed on the emitter 109, 802 is partially reacted into free radicals or reacted, and desorbed and delivered into the reaction volume. The reaction volume is shown in FIG. 1 as the V-shaped channel region between the conducting surface 106 and the injector 107, 108, 109. The chemical reactions occur in this V-shaped channel region or on the reaction surfaces in contact with this region. The vibrationally excited reaction products may deposit a substantial fraction of their vibrational energy into an electron of a conducting surface 106, producing one or more hot electrons. The reaction products may also include, but are not limited to, photons, vibrationally excited molecules, and free radicals.

The catalytic reactivity with respect to reactions occurring on the reaction surface 109 (FIG. 1) or 802 (FIG. 8) includes the reactivity associated with the presence of hot electrons on a surface. Recent experiments have demonstrated that such hot electrons with temperatures of order 5,000 Kelvin and above have altered the reaction kinetics of adsorbed species. Experiments showed that hot electrons caused vibrational excitation of the adsorbate species. Experiments showed that as a result of the energy imparted to the adsorbates by the electrons, reactions proceeded along paths inaccessible via thermal means, including highly endothermic reactions.

The dimension of the channel from the emitter to the collector defined by a region measured approximately from the geometric center of the cross section at electrode 109 to the center of the collector surface 106 is of order less than three times the energy diffusion length of vibrationally excited reaction products resulting from reaction initiation. This length is of order ½ to 1 micron at standard temperature and pressure (STP) conditions.

The collector 106 provides a conducting surface, with thickness dimension sufficiently thin to permit the hot electron to travel through the electrode 105 of the collector and into the highly doped p+ region of the semiconductor 104. The internal field produced by the p+ region 104 and p doped region 103 of the semiconductor tends to draw the electron to the p region 103. The stronger electric field produced by the junction of the p region 103 with the n doped semiconductor base 111 draws the electron over the diode junction. This diode junction is the interface between the p region 103 and the n region 111. In this manner, the diode that includes the p region 103 and n region 111 becomes forward biased, producing a useful voltage across the electrodes 102 and 112. The positive electrode 102 is connected to the diode electrode 105 and isolated from the diode base 111, e.g., n doped semiconductor base, by an insulator 101.

The thickness of the base semiconductor 111 may be chosen according to engineering needs. The thickness or height of the structure 110 supporting the emitter may similarly be chosen and may include raising the emitter more into the V-channel, e.g., one third of the way up from the bottom of the V-channel.

Referring to FIG. 8, the input of hot electrons into the thin, nanometers-thick conductive layer 109 or into layers 801 and 802 heats the electrons of the conductive layer faster than heating the vibrations of the conductive layer. This heating of electrons over atomic vibrations is enhanced by choosing the thickness of the conductive layers 109, 801, 802 to be less than about two times the energy diffusion parameter of the electrons, which thickness is of about order 10 to 50 nanometers.

The choice of materials of the conducting layers 109, 801, 802 may also enhance the heating of electrons. E.g., choosing materials with differing sound speeds, or with mismatched phonon band frequencies may result in more efficient confinement of electron energy. Such choices of materials further enhance thermal isolation and confines the energy in the electrons.

The choice of structures may enhance the confinement of hot electrons. E.g., placing the conducting layers 109, 801, 802 on pillars, nano-bridges or otherwise raised structures may also produce more efficient results for electron heating. Structures including a small number, e.g. less than 50, of monolayers of dissimilar conductors, e.g. silver layers on nickel and platinum layers on gold, forming quantum confinement of electrons, may also enhance hot electron confinement.

In one embodiment, pulsed hot electron injection device 107, 108, 109 (FIG. 8) deposits externally supplied energy in the conductive layers 109, 801, and 802.

The hot electron injection device energizes the chemicals adsorbed on the emitter surface and makes them act like a spark plug, triggering reactions in the gas surrounding the trigger or adsorbed on the trigger. The emitter operation starts with some energy source creating hot electrons in an injector. The injector conveys the hot electrons to chemicals adsorbed on the reaction surface. Hot electrons interacting with chemicals cause chemical reactions. Hot electrons also case physisorbed adsorbates on a reaction surface to become chemisorbed or desorb, and may also cause chemisorbed adsorbates to dissociate on the reaction surface or to become physisorbed or desorbed. Some reactions form autocatalyst chemicals, which are highly reactive chemicals. Some reaction products desorb from the reactive surface. The desorbed reaction products typically possess sufficient excess kinetic energy to initiate reactions in gas molecules. Desorbed products typically include autocatalysts which are necessary to sustain chemical reactions such as burning and combustion.

An example of one energy source creating hot electrons is an applied voltage across an insulator or semiconductor. Another example of an energy source is a light source, such as a flash lamp or a pulsed laser beam.

A pulsed hot electron injector may deposit the energy in a time that is so short that the hot electron energy deposits entirely in a nanometers thin reaction surface, heating it to effective temperatures of thousands of degrees Kelvin. This short duration, high intensity pulse of energy switches the reaction surface from an inactive or non-catalyst state to a highly reactive catalyst state.

The electrons alone may be heated to thousands of degrees. The characteristic time for this is of order 0.5 picoseconds. The phonons or vibrations are heated by the electrons, with characteristic times of order 1 to 3 picoseconds. The phonons dissipate into the lattice with characteristic phonon diffusion times of order 30 to 50 picoseconds.

The pulse duration of the pulsed hot electron injector, therefore, may include the use of devices that produce energy pulses such as optical or electrical pulses with durations of order less than the phonon diffusion time in the target conductive layers. The energy pulses such as optical or electrical pulses impinging on the conductive layers 109, 801, 802 create the pulse of hot electrons.

A pulsed hot electron injection device of this invention includes the use of devices that produce either optical or electrical pulses with durations of order less than the phonon diffusion time in the target conductive layers. A method of the invention includes using the optical pulse impinging on a conducting surface 109 to create the pulse of hot electrons. A method of the invention includes using an electrical pulse to drive a semiconductor device or a metal-insulator-metal device 108 designed to inject or transport hot electrons into its positive electrode 109, 801, 802 and to drive hot electrons from the electrode into the reacting surface 109, 802.

The method includes using an optical source of photons as the primary source of energy to create hot electrons. The optical photon energy shall be sufficient to create hot carriers in the semiconductor 108 conduction band. The subsequent diffusion of carriers drives hot electrons into thin conductive layers 109, 801, 802 on a semiconductor substrate.

In one embodiment, the injector includes a semiconductor 108 which creates hot electrons from absorption of light from an external optical source. In this embodiment, an optical source with photon energy to create caters in a semiconductor substrate 108 may be used to irradiate that semiconductor 108 and create hot electrons in its conduction band. The hot electrons so created in semiconductor 108 rapidly, e.g. within tens of picoseconds, diffuse into the reactive surfaces 109, 801, 802.

The semiconductors used in the present invention may include those with either direct or indirect band gaps. The lifetime of the created hot carriers in the semiconductors with indirect band gaps may be as long as microseconds. Examples of such semiconductors with indirect band gaps include but are not limited to silicon (with band gap of order 1.12 eV), germanium (with band gap of order 0.66 eV), PbTe (with band gap of order 0.31 eV), and PbS (with band gap of order 0.41 eV).

In semiconductors with direct band gaps, the mobility of the created hot carriers may be high compared to other semiconductors. The band gap in such semiconductors may be engineered. Examples of such semiconductors with direct band gaps include but are not limited to $In_{-x}\ Ga_{-y}\ As_{-z}\ Sb_{-w}$, where the band gap can be adjusted over a range including 0.1 eV through 1.5 eV. The x, y, z, w values represent the fractional concentrations of each element.

The hot electrons created in the underlying semiconductor 108 that move into the conductive overlayer 109, 801, 802, i.e., a reaction surface 109, 801, 802, may become trapped on the reaction surface 109, 801, 802 because the hot electron lifetime in the surface is less than tens of femtoseconds, which is orders of magnitude shorter than the lifetime in the semiconductor. A hot electron in the substrate 108 has a very long life time by comparison and may diffuse through the semiconductor 108 for times exceeding many picoseconds and ranging even to microseconds. The hot electron inevitably diffuses into the conductive overlayer 109, 801, 802.

To achieve this diffusion, a pn junction semiconductor with the p side ohmically or almost ohmically attached to the reaction surface 109 may be used. The semiconductor 108 may include an n type semiconductor at the junction with the electrode 107 and become and formed to be p type at the other electrode 109.

The novel feature of the device includes the ohmic or almost ohmic contact with the valence band and demonstrates the desirable property of conveying the full, conduction band electron energy into the reaction surface 109.

In one embodiment, a Schottky diode may be used. Gold and platinum form desired Schottky junctions with silicon, and therefore, may be used to form a hot electron injection diode. Gold has the longer hot electron diffusion length, and therefore, may be more desirable in some applications. Platinum has the higher catalytic activity, and therefore, may be more desirable in other applications. E.g., gold nanostructures have been shown to catalyze the reaction of CO with oxygen, while platinum has been shown to catalyze the reaction of ethanol and methanol with oxygen, and both at temperatures within the operating range of silicon, i.e., less than 370 degrees Kelvin. The RuO2 or alumina-oxide-metal reaction layer 801, 802 may be deposited on the conductive contact 109 of the metal-silicon Schottky junction 109, 108 as shown in FIG. 8, where the conductor thickness is less than three times the diffusion dimension of hot electrons surmounting the Schottky junction 108–109, and where the conductor 109, 802 is selected for convenience.

In one embodiment, the pulse of hot electrons heats the metal 109 of the Schottky junction and hence heats the catalysts 801, 802, e.g., RuO2 or spiked alumina, causing the catalysts to become highly reactive. Nearly all metals may form a Schottky junction diode with silicon.

An electrical pulse forward biases the diode 107, 108, 109, with the negative terminal 107 connected to the semiconductor and the positive terminal 109 connected to the diode conductive electrode 109. This diode uses an n type semiconductor with a conductive electrode 109. The electrode 109 is biased positive and the semiconductor 108 is biased negative. The conductive electrode 109 and any conductor 801, 802 on top of it is formed with dimension of order less than three diffusion lengths for hot electrons.

Upon switching the electrical pulse into electrodes 107, 109, the hot electrons surmounting the diode Schottky barrier then flood the positive thin diode conductive electrode 109 with a pulse of hot electrons. The hot electrons equilibrate with the electrons in the electrode 109 and raise the instantaneous electron temperature.

Similarly, in an embodiment having an electrically pulsed pn junction diode 107, 108, 109, the electrical pulse forward biases the diode. In this embodiment, the p side of the semiconductor is faced towards the reacting surface 801, 802. An electrical contact 109 is formed to the p type semiconductor so that the conducting electrode forms an almost ohmic junction. Composite catalysts 801, 802 are formed in contact with the electrical contact as the reaction surface.

In an emitter embodiment having electrically pulsed metal-insulator-metal junctions or semiconductor-insulator-metal junctions for injector, the conductive layer receiving the electrons that cross the insulator 108 is formed similarly thin, e.g., with dimension of order less than three diffusion lengths for hot electrons. In this embodiment, the electron transport may be via tunneling through the insulator 108, passing through its conduction band. Transport may be also via electrons with energy greater than the Schottky barrier. The transport may be resonant with adsorbates on the reactive surface can be enhanced by choice of adsorbates through choices of fuel, oxidizers, and additives.

In one embodiment, electrically pulsed, solid state optically emitting diodes deliver up to 30 picosecond duration pulses of photons to a conductive surface. The diodes may illuminate the surface from behind, through substrates transparent to the radiation emitted by the diode, e.g., as appropriately chosen material 111, 108. E.g., a diode emitting 1 eV photons in the infra-red may pass through materials 111 with 1.5 eV or larger bandgap. Such materials include GaAs, alumina, or insulators.

In one embodiment, the electrically pulsed solid state optically emitting diodes deliver pulse compressed optical radiation, using e.g., chirped pulses compressed using dispersive media.

In one embodiment, pulses are chosen to have durations less than approximately 10 to 50 picoseconds, depending on injector and reactive surface material thermal conductivity and energy transport properties. This duration is approximately the time for the energy deposited by the electrons to migrate via phonon heat conduction from the reactive surface into the underlying injector material 109.

Commonly available 30 GHz transistors, radio frequency pulse generators, magnetic, electrical storage, and pulse compression systems may be used to produce pulse durations satisfying the criteria of less than 10 to 50 picoseconds pulse durations. These generators include power signal generators typically used to generate millimeter waves, e.g., those used in satellite communication or in radar pulse generation. Such power signal generators include gun diodes, vacuum tube devices, klystrons, magnetrons, and any of many devices currently available to generate pulses with duration less than approximately 50 picoseconds.

In one embodiment, the pulsed electric generator of the present invention includes the emitter 109, 801, 802, the energy collector 101, 102, 103, 104, 105, 106, 111, 112, and a reaction volume, which is the region between the emitter and the energy collector. In one embodiment, the emitter may be an integral part of the collector. In another embodiment, the emitter and the collector may be the same physical device.

E.g., a semiconductor diode energy converter may be operated in the reverse mode to provide hot electrons to its surface, which may render it an emitter. An advantage of an integral emitter and collector is simplicity of design. A pulse applied to the emitter initiates reactions and the reactions in turn generate electricity in the collector. Thus, the same device may initiate reactions and collect energy. The result is the equivalent to stimulating a negative resistance.

In another embodiment, an emitter and a collector may be separate. Having a separate emitter and collector allows the two to operate at different temperatures. E.g., the collector may include semiconductor devices that operate more efficiently at lower temperatures. The emitter may not require the use of temperature sensitive semiconductors, and may operate at higher temperatures for more efficiency.

Referring to FIG. 7, an initiator pulse is sent into a transmission line 700, 701, 702 to emitter electrodes 707, 709. When the emitter is also a collector and because of the pulsed reactions a pulse with more energy than the initiator pulse is received into the transmission line from the collector.

Figure 9:
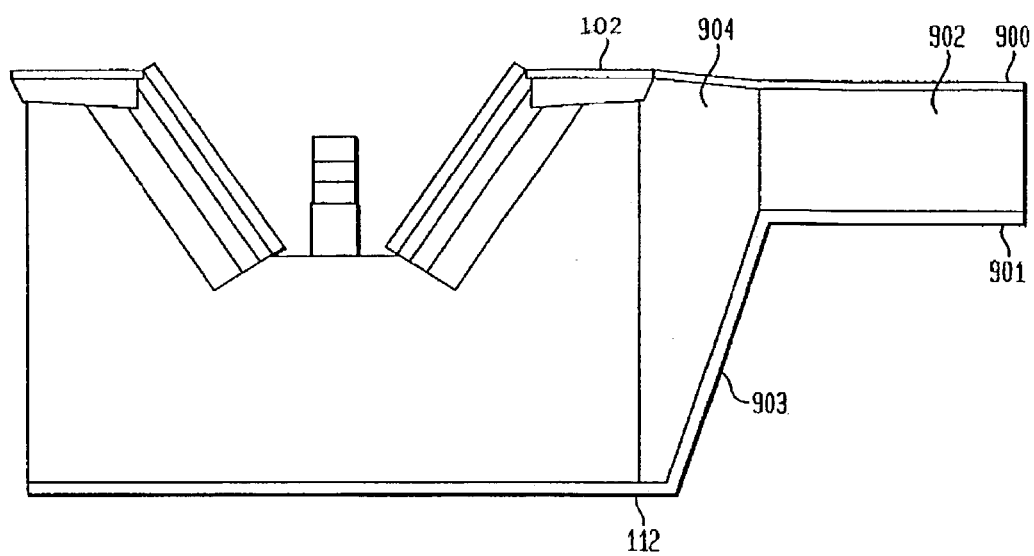
FIG. 9 shows a transmission line used to drive an emitter injector that is also a collector.

The transmission line may also connect to collector electrodes. The emitter and collector may be the same physical device. Referring to FIG. 9, an initiator pulse sent into the transmission line 900, 901, 902 propagates to its output electrodes 903, 904 and energize emitter electrodes 102, 112. The emitter and collector electrode may be one and the same. However, the emitter stripline may be distinct from the collector output system.

Figure 2:
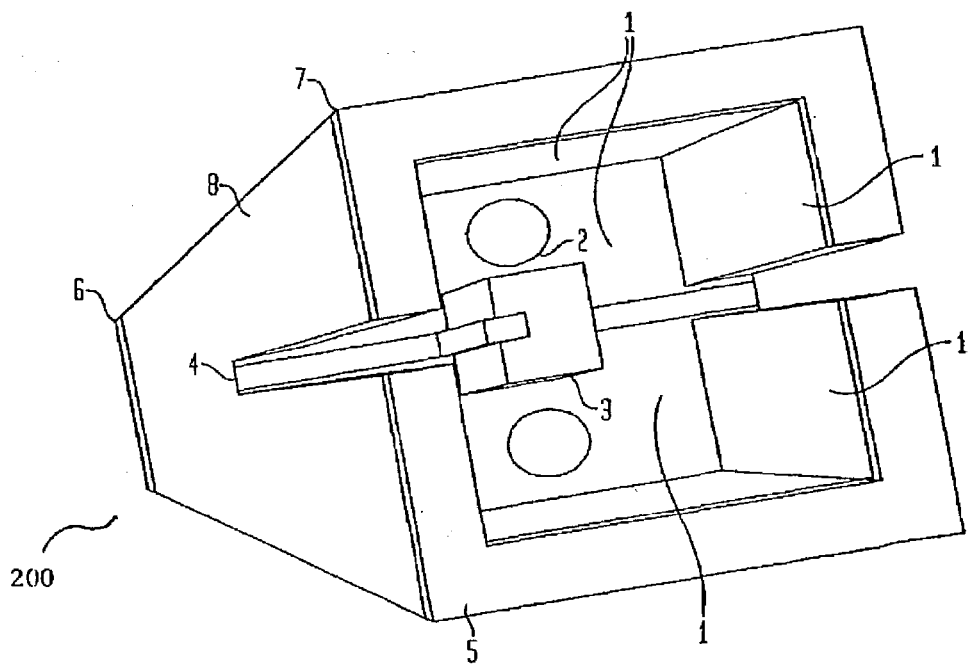
FIG. 2 shows the device having a box structure.

FIG. 2 shows the device having a box structure. For descriptive purposes only, the device is shown isolated and standing alone. In practice, a base semiconductor 8 is used to hew boxes 200, resulting in an array of the boxes 200 stacked next to one another. E.g., a another of the semiconductor base 8 may form an adjacent wall.

The fuel is injected or diffused into the reaction region from the bottom of the device and air diffuses from the top. The collector, emitter, and reaction region elements of this device are similar to those of shown in FIG. 1. The collector 1 forms the inside walls of the box formed out of the semiconductor 8. Fuel port 2 allows fuel to enter the reaction region inside the box.

Having the fuel enter the reaction region inside the box permits direct evaporative cooling of the semiconductor 8. Direct cooling of the device precisely at the point where heat may be generated and is a novelty of the configuration and permits higher power operation at a given average temperature.

The box geometry is also appropriate when fuel and air are fed to the device premixed. In this case the fuel port 2 may be used to feed both fuel and air, or to feed alternate fuels and oxidizers, or as a carburator, or may be eliminated entirely, depending on engineering needs.

A fuel-rich emitter may also be advantageous. The production of autocatalysts may be greatly enhanced by providing the emitter with a set of chemicals that readily dissociate and preferentially produce autocatalysts upon hot electron stimulation. In this case, the fuel port may serve instead as the port for such additives, such as fuels and/or oxidizers. This may also serve to permit lean mixtures of fuel and air, which may also provide a cleaner reaction.

The emitter 3 is energized by emitter electrodes 4 and 6, and initiates the chemical reaction between fuel and oxidizer. Collisions of the vibrationally excited products with the collector wall 1 forward bias the semiconductor 8 that is connected to negative electrode 6 and positive electrode 5. Electrode 5 is isolated from semiconductor 8 by an insulator 7.

Figure 3:
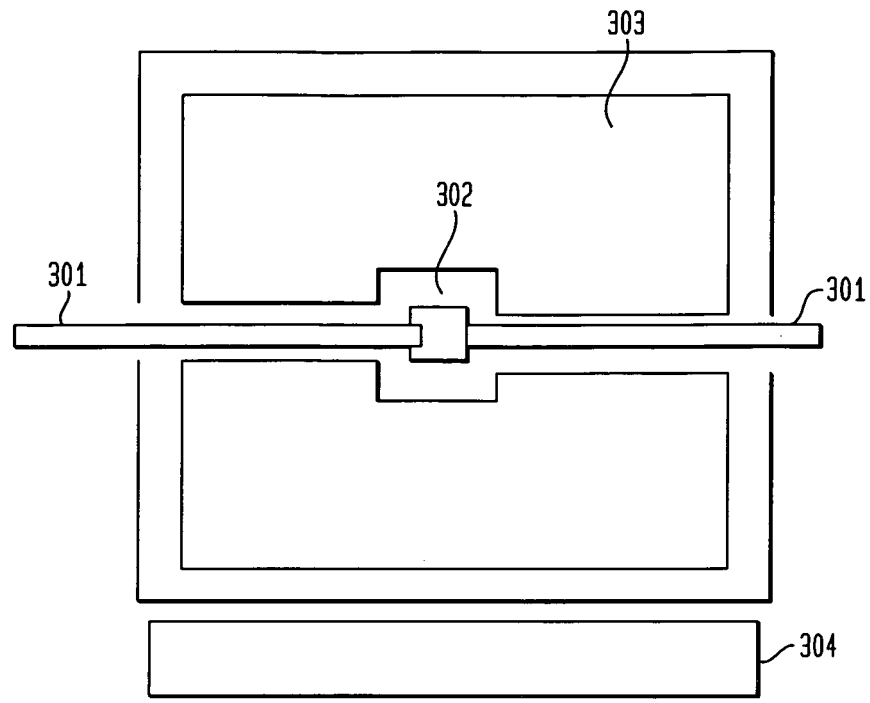
FIG. 3 shows a top view of a gas-phase-reactant, pulsed electric generator using a reaction stimulator in either flat or V-channel geometry.

FIG. 3 shows a top view of a gas-phase-reactant, pulsed electric generator using a reaction stimulator in either flat or V-channel geometry with the fuel port 304 being adjacent to the collector. The fuel port 304 is located adjacent to the collector 303 and surrounds the emitter 302 and the electrodes 301.

Figure 4:
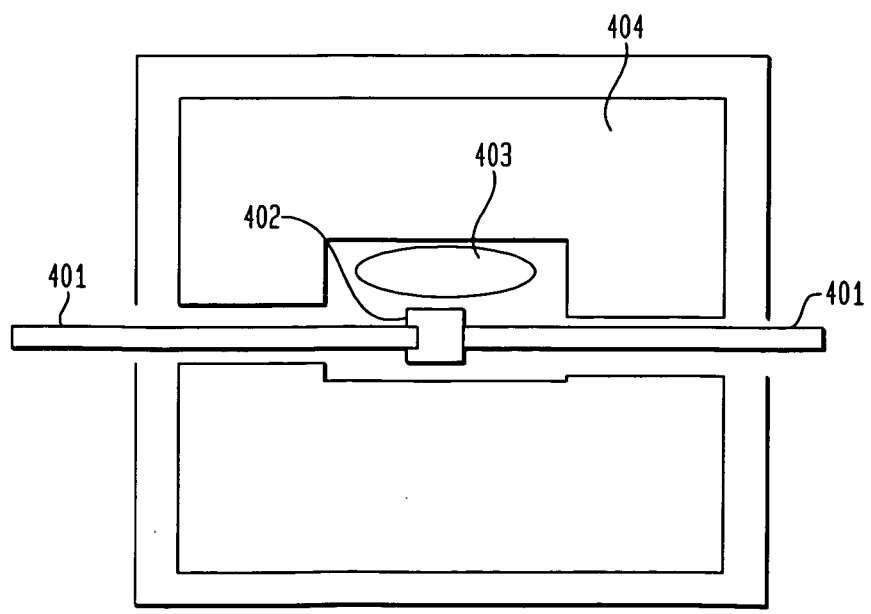
FIG. 4 shows a schematic top view of a gas-phase-reactant-pulsed electric gentrator using a reaction stimulator in either a flat or a V geometry with a single fuel port.
Figure 5:
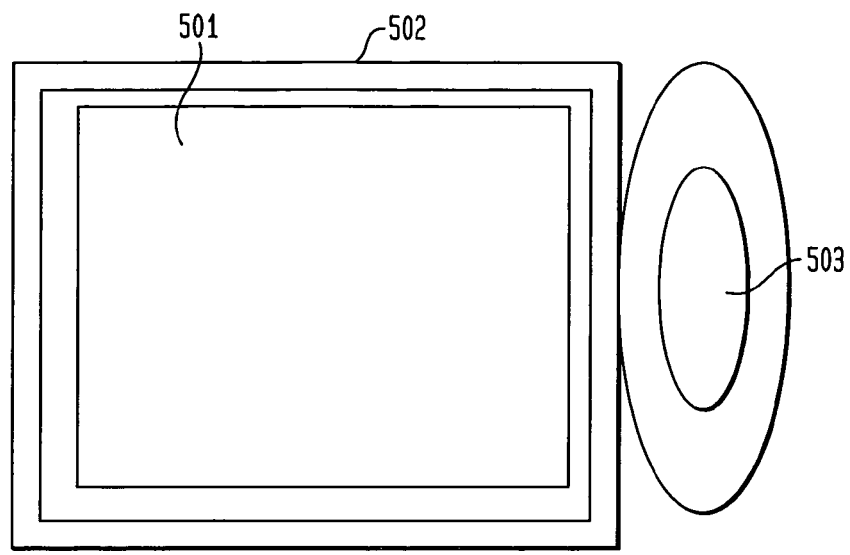
FIG. 5 shows a gas-phase-reactant-pulsed electric generator with emitter surrounding the collector.

FIG. 4 shows a schematic top view of a gas phase reactant, pulsed electric generator using a reaction stimulator in a either a flat or a V geometry with a single fuel port. The gas diffusion process with dimension of order of the diffusion length for the excited state specie permits flat geometries to be nearly as efficient as enclosing geometries such as the box. Emitter 402 with electrodes 401 are shown separate from the collector 404. The reaction region is out of the plane of the drawing. The substrate semiconductor extends into the plane. The fuel emerges from the fuel port 403 from the bottom of the device and into the reaction region above the plane. FIG. 5 shows a configuration similar to that of FIG. 4, with emitter 502 surrounding the collector 501. In this embodiment, a fuel port 503 is located adjacent to the structure. This configuration may be repeated over the surface of the semiconductor.

Figure 6:
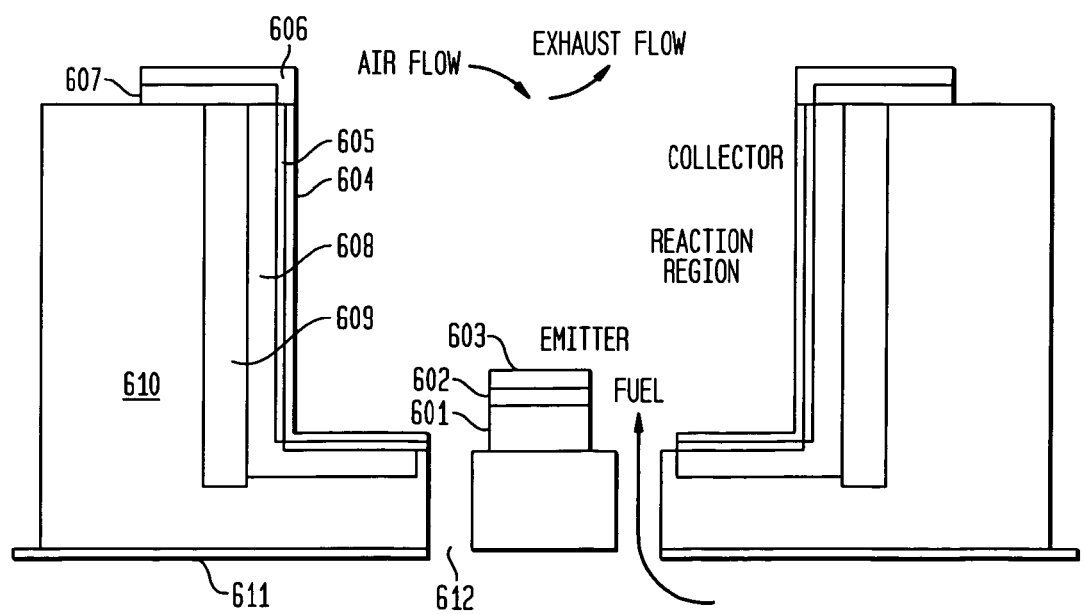
FIG. 6 shows a schematic cross section diagram of gas-phase-reactant-pulsed electric generator using a reaction stimulator in a box geometry with a fuel port.

FIG. 6 shows a schematic cross section diagram of gas-phase-reactant-pulsed electric generator using a reaction stimulator in a box geometry with a fuel port, and shows more detail for the geometry of the device shown in FIG. 2. The collector includes negative electrode 611, n doped semiconductor 610, p doped semiconductor 609, p+ heavily doped 608, diode electrode conductor 605, collector conductor surface material 604, positive electrode 606, and electrical isolating insulator 607. Fuel enters from the bottom of the device through fuel port 612. The emitter is shown with an electrode 601, thin insulator 602, and reactive surface 603. A structure under the emitter is omitted to show that it may be an option to omit the extra structure.

Fuel port 612 is shown entering in close proximity to the emitter 601, 602, 603, to suggest the option of a fuel rich ignition region and the feature of a cooling of the semiconductor 610 closest to the hottest element, the emitter.

In one embodiment of the present invention, semiconductor diodes are used to collect and convert photons into electricity in addition to the hot electrons. E.g., a thin conducting surface is used to convert the energy of vibrationally excited molecules into hot electrons. The semiconductor diodes are then used to convert the both the photons and the hot electrons into a forward bias across the diode, which generates electricity.

Many geometries of emitter, reaction region, and collector may exhibit useful efficiencies and features. In one aspect, a spherical collector surface encloses a spherical reaction volume with a point emitter in the center, with the radius of the sphere less than three diffusion lengths for vibrationally excited specie. The semiconductor outside the sphere is used to form the collector diode. Fuel and air enter through holes or ports in the semiconductor. Exhaust leaves the system through ports, holes, or channels in the emitter at the center of the sphere, for example through a tube or pipe from the center to outside the sphereThe emitter may operate at an higher temperature than the collector. In one embodiment, the reaction volume is enclosed in a box with one end open to reactant and exhaust flow. The emitter structure is placed in the center of the box as shown in FIG. 2 and FIG. 6.

In one embodiment, the emitter (FIG. 6, 601, 602, 603) in the present invention may include a reaction surface to receive and use hot electrons and an injector (FIG. 6, 601, 602) tat generates and provides the hot electrons. The reaction surface (FIG. 6, 603) includes a conductor and may optionally include layers of material. The layers of material may include conductors.

The injector produces the hot electrons and injects them into the reaction surface. This injector may include but is not limited to any one or combination of the following devices: Schottky diode; pn junction diode; metal-semiconductor-metal device; metal-insulator-metal device; semiconductor-insulator-metal device; quantum well; optical generator where the optical radiation impinges directly on the thin conductive reaction surface from behind or from the front; optical generator where the optical radiation impinges on a semiconductor, creating hot carriers in the semiconductor which migrate to a similarly thin conductive electrode surface.

When the injector, i.e., hot electron producer, 107, 108 (FIG. 1) is a Schottky diode, the semiconductor provides electrons that surpass the Schottky harrier and travel from. the semiconductor 108 into the conductor 109 that forms the electrode 109 of the diode. The electrode 109 and any materials 801, 802 (FIG. 8) on the electrode form the reaction surface.

When the injector is a pn junction diode, the p type semiconductor provides electrons from its conduction band. The electrons in this embodiment are minority carriers that travel into the ohmic or almost ohmic electrode 109 and come in contact with the valence band of the p type semiconductor 108. The electrode 109 and any materials 801, 802 on the electrode form the reaction surface.

When the injector is a metal-semiconductor-metal or metal-insulator-metal device, one metal 107 is biased negative and the other metal 109 is biased positive. Electrons originating in the one metal 107 travel through the metal-insulator or metal-semiconductor layer 108 and are driven into the other metal 109, biased positive, appearing as hot electrons in the metal 109. The electrode biased positive and any matelals 801, 802 on the electrode form the reaction surface.

When the injector is an optical generator where the optical radiation impinges directly on the thin conductive reaction surface 109 either from behind or from the front, then the impinging creates hot electrons. The conductive reaction surface 109 has thickness dimension of order less than approximately three diffusion lengths for hot electrons. The thin conductive reaction surface and any materials 801, 802 on the elecirode form the reaction surface. When the injector is an optical generator where the optical radiation impinges on a semiconductor, the impinging creates hot carriers in the semi conductor 108 which diffuse to an appropriately thin conductive electrode surface 109. The electrode may or may not be deliberately biased using external energy sources. The electrode and any material 801, 802 on the electrode form the reaction surface.

Any known method may be used to energize the injector that generates a pulse of hot electrons. These methods include but are not limited to using devices such as gyrotrons, microwave power sources, and regenerative solid state devices. The regenerative devices include pnpn and npnp thyristor-type devices. These types of devices include light emitting diode stimulated Zener breakdown stimulators/accelerators, stripline pulse compression methods, optical pulse compression methods, tunnel diode, and resonant transfer devices, Gunn diodes, nano-triodes, and nano-vacuum tube systems.

These energizing devices may be formed integrally or separate from the injector device that drives the hot electrons into a reaction surface. The reaction surface is then heated to temperature in excess of the emitter substrate 109.

The surface to receive hot electrons includes a conductor 109 with thickness dimension less than three diffusion lengths for hot electrons. In one embodiment, the surface 109 and the reaction surface 801, 802 are part of the same element. On one side, e.g., the side facing the element 108, electrons may be generated and on the other side, e.g., the side facing the reaction volume containing the fuel and oxidizers, chemical specie impinge on the surface 109, 801, 802 and adsorb, react or otherwise interact. The thickness dimension is measured from the side facing reacting gas or materials to the side interfacing with the injector 108. This dimension is generally designed to be less than three times the diffusion length for hot electrons. e.g., this dimension is of order 10 nanometers or more for gold, silver, and aluminum.

In one embodiment, an optical pulse may be generated using a flash lamp, electrical gas discharge, optically emitting solid state device, pulsed laser, or pulsed diode laser. The pulse of hot electrons are stimulated by dumping the charge stored in a capacitor or in the effective capacitance of a semiconductor junction.

The pulse durations and dead time intervals are tailored to meet the engineering considerations in designing the device of the present invention, including considerations of thermal heat flow. Pulse durations and dead times may be longer than microseconds. E.g., the pulse duration for energizing is chosen so that the energy collector reaches it maximum operating temperature and then cooled down to the desired heat sink temperature during the dead time intervals.

The dead time interval, i.e., interval between energizing pulses, is typically shorter than a time associated with the dissociation of precursors to dissociation. This interval is typically of order ten nanoseconds for oxygen on platinum at room temperature. A precursor is a trapped, intermediate form of an adsorbate as it successively surmounts activation barriers towards dissociation on a catalyst or reaction surface.

In one embodiment, reactive species are injected into the reaction region by supplying a third specie to the emitter, e,g, a fuel catalyst or an oxidizer or a hypergolic material or a monopropellant or an initiator or reaction intermediates or autocatalysts or a mixture of these, in addition to fuel and air, to stimulate the reaction. The third species dissociate or react to form reaction stimulators. The energizing pulses cause the products of a fuel catalyst supplied to the reacting surface to stimulate pulsed fuel-oxidizer reactions.

The fuel catalysts may include but are not limited fuel and oxidizer mixtures, unstable specie such as hydrazine, monomethyl hydrazine, or high explosives. The fuel and oxidizer mixtures include but are not limited to fuels such as ammonia, oxidizers such as hydrogen peroxide, or halogen oxidizers.

In one embodiment, the reactive species are placed into a volume in direct contact with the conducting surface. The concentration of the reactive species in the volume may be adjusted so that they become depleted of reactants during the time when the system is in its dead time, e.g., by using reactive mixtures in the combustible range or using lean mixtures. Advantageously, fuels adsorb on to many catalyst surfaces as well as oxygen, so that an optimum fuel-oxidizer ratio may form on the reaction surface from a lean mixture in the gas phase in the volume. Also during the dead time, the volume may be replenished with more reactive species.

The hot electrons and hot atoms from the products of the reaction are collected or otherwise used. The products are further used to sustain the duration of high reactivity of the reaction surface.

The radiation emitted by hot atom reactions may be collected in the form of optical radiation. The optical radiation typically results from inverted populations such as from hot atom reactions.

The reacting surface's temperature is raised without raising the underlying substrate temperature above 600 Kelvin by using short reaction times and pulses. The temperature of electrons in the surface is raised to above 5,000 Kelvin, and the phonons to above 2,000 Kelvin. The temperature of the substrate is kept under a temperature that would destroy the substrate's properties. Such temperatures are typically under 600 Kelvin. When the temperatures are kept under 600 Kelvin, a substrate would typically maintain its desirable properties.

While this invention depicts the reaction stimulation using hot electrons, the invention also pertains to the use of hot holes. The use of hot holes entails swapping the reference to electrons with holes, swapping valence band for conduction band, and swapping positive with negative. Such swappings between electrons and holes are well known in the art.

While the invention has been shown and described with respect to particular embodiments thereof, it will be understood by those skilled in the art that the foregoing and other changes in form and details may be made therein without departing from the spirit and scope of the invention.

The invention claimed is:

1. A gas-phase-reactant-pulsed electric generator, comprising:

an emitter having at least a reaction surface, the emitter operable to emit hot electrons in pulses into the reaction surface to initiate chemical reactions, a reaction region surrounding the emitter operable to contain the chemical reactions initiated on the reaction surface, the chemical reactions producing highly vibrationally excited products; and a collector near the reaction region, the collector comprising at least a conductor whose first surface is in contact with a reaction region that is completely or partly enclosed by the first surface and whose second surface is in contact with a semiconductor, the thickness of the conductor from the first surface to the second surface being sufficiently thin to permit hot electrons emitted from highly vibrationally excited products to the conductor to travel through the conductor into the semiconductor, charging the semiconductor to a useful forward bias that is converted into electrical energy.

2. The device of claim 1, wherein the reaction region includes a surface of the emitter.

3. The device of claim 1, wherein the reaction region includes a surface of the collector.

4. The device of claim 1, wherein the emitter and the collector are on a same surface.

5. The device of claim 1, wherein the emitter and the collector are a same one device.

6. The device of claim 1, wherein the reaction region is formed as a V-channel by the surrounding collector.

7. The device of claim 1, wherein the reaction region is partly enclosed by the surrounding collector.

8. The device of claim 1, wherein the emitter includes:
an insulator;
a first electrode connected to a first side of the insulator; and
a second electrode connected to a second side of the insulator, the second electrode forming the reaction surface,
wherein energy pulses can be applied across the first electrode and the second electrode to stimulate reaction on the reaction surface.

9. The device of claim 8, wherein the insulator has thickness dimension that is less than three times the energy diffusion length of hot electrons traversing the insulator.

10. The device of claim 1, wherein the emitter includes one or more of a forward biased diode, a metal-insulator-metal device, a semiconductor-insulator metal device, a semiconductor-metal device, an optical device, and a quantum well.

11. The device of claim 1, wherein the device further includes a strip transmission line connected to the emitter for driving energy pulses into the emitter.

12. The device of claim 11, wherein the strip transmission line includes a dielectric material in contact with one or more electrodes.

13. The device of claim 11, wherein the strip transmission line includes a dispersive transmission line designed to compress pulses.

14. The device of claim 1, wherein the reaction surface includes a catalyst.

15. The device of claim 1, wherein the collector includes a reaction surface.

16. The device of claim 1, wherein the emitter includes a semiconductor whose p side is ohmically or almost ohmically attached to the reaction surface.

17. The device of claim 1, wherein the emitter includes an electrically pulsed solid state optically emitting diode.

18. The device for generating energy as claimed in claim 1, wherein the collector further includes:
a conductor electrode connected to the conductor; and
a collector electrode in ohmic contact with the semiconductor,
wherein the hot electrons created in the collector cause the semiconductor to become forward biased and produces useful voltage across the collector electrode and the conductor electrode.

19. The device of claim 1, wherein the collector further includes:
a quantum well structure directly connected to the first conductor surface.

20. The device of claim 1, wherein the collector includes:
a Schottky diode directly connected to the second conductor surface.

21. The device of claim 20, wherein the semiconductor forms part of the Schottky diode.

22. The device of claim 1, wherein the first conductor conducting surface is supplied with one or combination of fuel and oxidizer additives.

23. The device of claim 1, wherein the first conducting surface with includes superlattice structures.

24. The device of claim 1, wherein the conductor is formed from material with a Debye temperature property chosen to optimize the ratio of hot electrons and phonons generated upon exposure to reaction products.

25. The device of claim 1, wherein the collector collects electromagnetic radiation.

26. The device of claim 1, wherein the semiconductor includes:
a highly doped p+ region;
a p doped region; and
a n doped region.

27. The device of claim 1, wherein the device further includes a fuel port in close proximity to the emitter.

28. The device of claim 1, wherein the electrical energy is stored and used to energize the emitter to emit hot electrons.

29. The device of claim 1, wherein the emitter is energized initially from one or more of pulse of energy, reaction intermediates, autocatalysts, monopropellant, reaction stimulators, optical pulses, pulsed laser radiation, optical radiation.

30. The device of claim 1, wherein the conductor includes catalysts.

31. The device of claim 1, wherein the conductor includes a plurality of layers of one or more materials.

32. The device of claim 1, wherein the reaction surface and the first conductor surface are formed from same material.

33. The device of claim 1, wherein the emitter and the collector are next to one another.

34. The device of claim 1, wherein the emitter and the collector are one same component and the reaction surface is the first conductor surface.

35. A device for extracting a net excess of useful work, comprising:
an emitter having at least a reaction surface, the emitter operable to emit hot electrons in pulses into the reaction surface to initiate chemical reactions,
a reaction region surrounding the emitter operable to contain the chemical reactions initiated on the reaction surface, the chemical reactions producing highly vibrationally excited products; and
a collector near the reaction region, comprising at least a conductor whose first surface is in contact with a reaction region that is completely or partly enclosed by the first surface and whose second surface is in contact with a semiconductor, the thickness of the conductor from the first surface to the second surface being sufficiently thin to permit hot electrons emitted from highly vibrationally excited products to the conductor to travel through the conductor into the semiconductor, charging the semiconductor to a useful forward bias that is converted into electrical energy, the dimension of the reaction region being such that a distance from a geometric center of the reaction region to a nearest collector surface is less than three times an energy diffusion length of the highly vibrationally excited reaction products.

* * * * *